(12) United States Patent
Li et al.

(10) Patent No.: US 12,014,971 B2
(45) Date of Patent: Jun. 18, 2024

(54) THERMAL INTERFACE STRUCTURES, ELECTRICAL SYSTEMS WITH THERMAL INTERFACE STRUCTURES, AND METHODS OF MANUFACTURE THEREOF

(71) Applicant: NXP USA, Inc., Austin, TX (US)

(72) Inventors: Lu Li, Gilbert, AZ (US); Sharan Kishore, Tempe, AZ (US); Freek Egbert van Straten, Mook (NL); Lakshminarayan Viswanathan, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 319 days.

(21) Appl. No.: 17/335,077

(22) Filed: Jun. 1, 2021

(65) Prior Publication Data

US 2022/0384307 A1    Dec. 1, 2022

(51) Int. Cl.
*H01L 23/433*    (2006.01)
*H01L 23/373*    (2006.01)
*H01L 23/40*    (2006.01)

(52) U.S. Cl.
CPC ........ *H01L 23/433* (2013.01); *H01L 23/3736* (2013.01); *H01L 23/4006* (2013.01); *H01L 2023/405* (2013.01)

(58) Field of Classification Search
CPC .............. H01L 23/433; H01L 23/3736; H01L 23/4006; H01L 2023/405; H01L 23/3677; H01L 23/373; H01L 23/3735; H01L 23/3737; H01L 23/42; H01L 23/3672; H01L 21/4882; H01L 23/40
USPC .................................................. 257/69, 690
See application file for complete search history.

(56) References Cited

U.S. PATENT DOCUMENTS

| | | |
|---|---|---|
| 4,896,955 A | 1/1990 | Zider et al. |
| 7,539,019 B2 | 5/2009 | Wayman et al. |
| 7,995,344 B2 | 8/2011 | Dando et al. |
| 8,720,537 B2 | 5/2014 | Kubo et al. |
| 8,821,244 B1 | 9/2014 | Alexander et al. |
| 9,437,515 B2 | 9/2016 | Colgan et al. |
| 9,615,486 B2* | 4/2017 | De Bock et al. ........ H05K 7/20 361/679.46 |
| 2007/0015042 A1* | 1/2007 | Ji et al. .................. H01M 4/94 429/44 |

(Continued)

FOREIGN PATENT DOCUMENTS

| | | |
|---|---|---|
| EP | 3398907 A1 | 11/2018 |
| EP | 3522689 A1 | 8/2019 |
| JP | 6155517 A | 6/1994 |

OTHER PUBLICATIONS

Panasonic; ""PGS" Graphite Sheets"; 11 pages (Oct. 2017).

(Continued)

*Primary Examiner* — Caleen O Sullivan
(74) *Attorney, Agent, or Firm* — Sherry W. Gourlay; Bruce M. Green

(57) ABSTRACT

A thermal interface structure for transferring heat from an electronic component to a system heat sink includes a stack of one or more layers of a stiff thermal interface material and one or more layers of a compliant thermal interface material stacked on and connected to the one or more layers of the compliant thermal interface material. In some embodiments, the thermal interface structure also may include one or more layers of a shape memory alloy and/or a collapsible encasement.

22 Claims, 14 Drawing Sheets

(56) References Cited

U.S. PATENT DOCUMENTS

| | | | |
|---|---|---|---|
| 2007/0230130 A1 | 10/2007 | Alcoe et al. | |
| 2008/0073775 A1* | 3/2008 | Brunschwiler et al. | H01L 23/12 257/704 |
| 2009/0151907 A1* | 6/2009 | Karidis et al. | F28D 15/00 165/104.33 |
| 2012/0061135 A1* | 3/2012 | Hill | H05K 9/009 174/388 |
| 2018/0027691 A1* | 1/2018 | Czaplewski | H05K 7/20 |

OTHER PUBLICATIONS

Seo, Junwon et al; "Pilot Study for Investigating the Cyclic Behavior of Slit Damper Systems with Recentering Shape Memory Alloy (SMA) Bending Bars Used for Seismic Restrainers"; Applied Sciences 5(3); pp. 187-208 (2015).

U.S. Appl. No. 16/857,134 not yet published; 47 pages (Apr. 23, 2020).

Bill Hammack, "Nitinol: The Shape Memory Effect and Superelasticity", YouTube, https://www.youtube.com/watch?v=wl-qAxKJoSU, (Oct. 25, 2018), Prepared descrip. pp. 1-18.

Nexmetal, "Nitinol foil activated by hot tap water 2x2 inch sheet", YouTube, https://www.youtube.com/watch?v=Mk1pu5-M7DE&feature=emb_title, (Sep. 6, 2016), Prep'd descrip. pp. 1-2.

\* cited by examiner

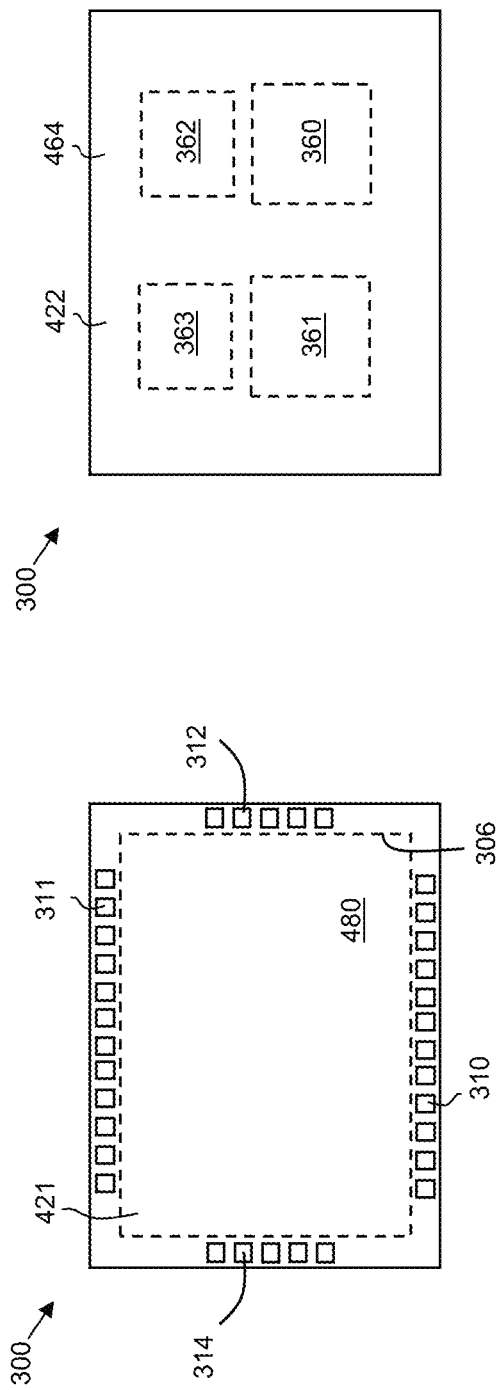

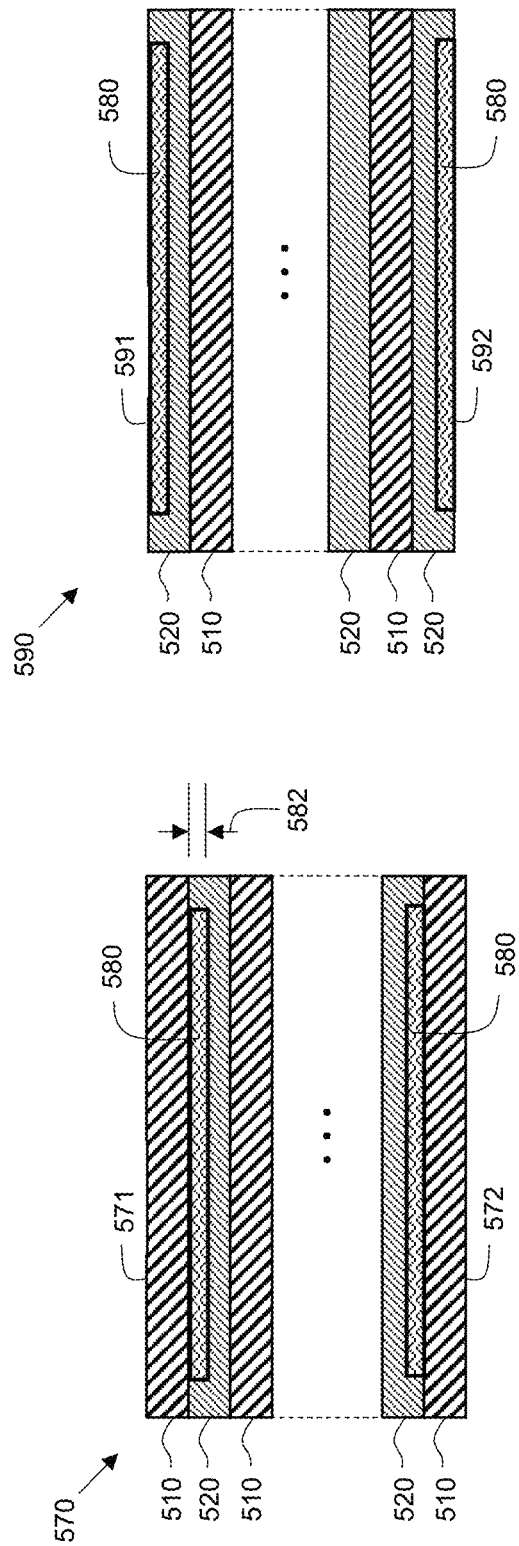

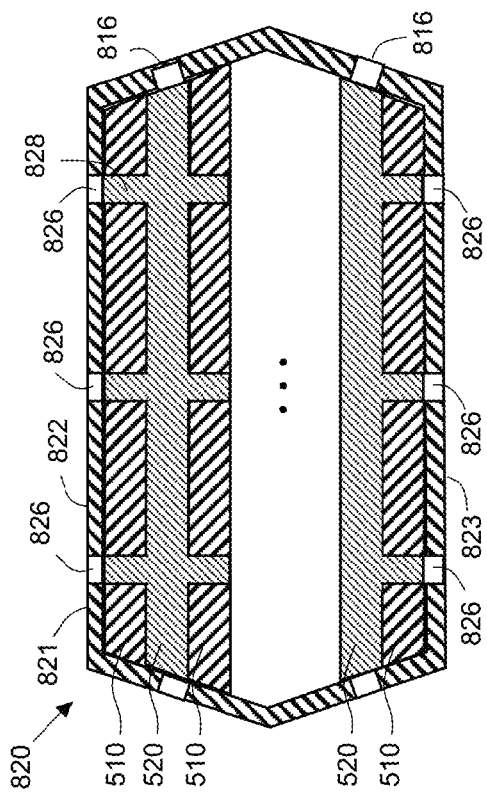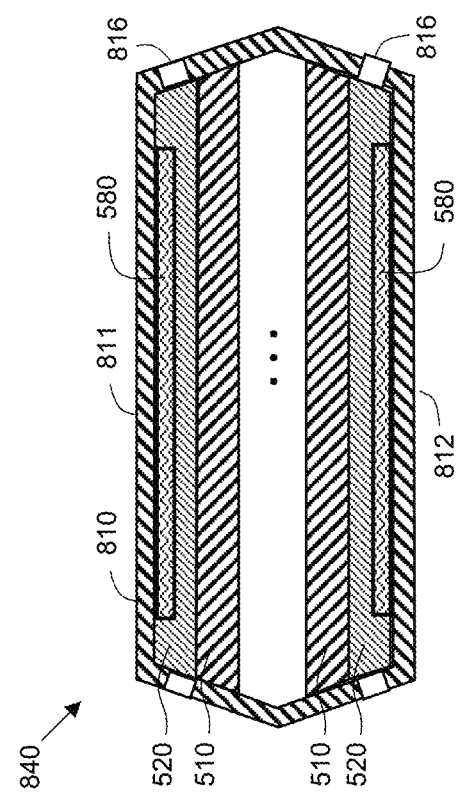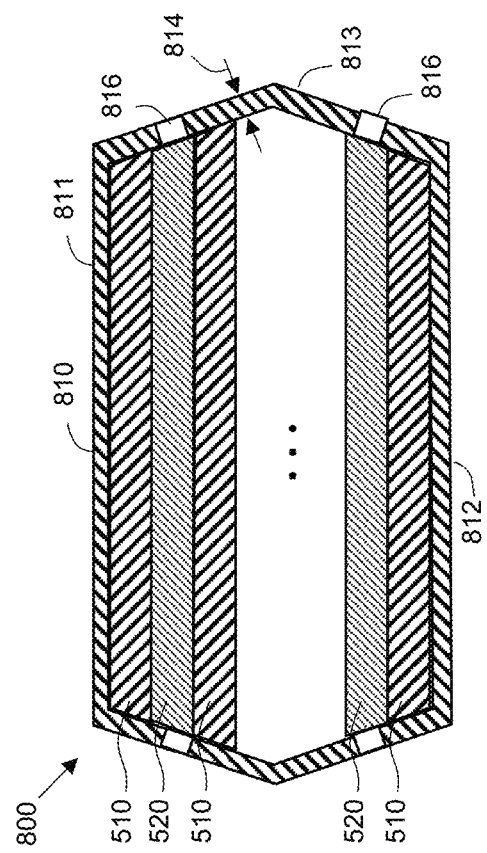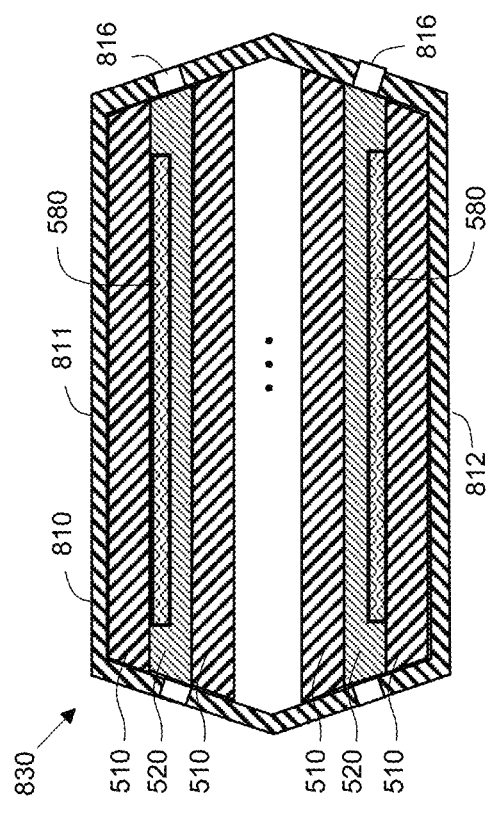

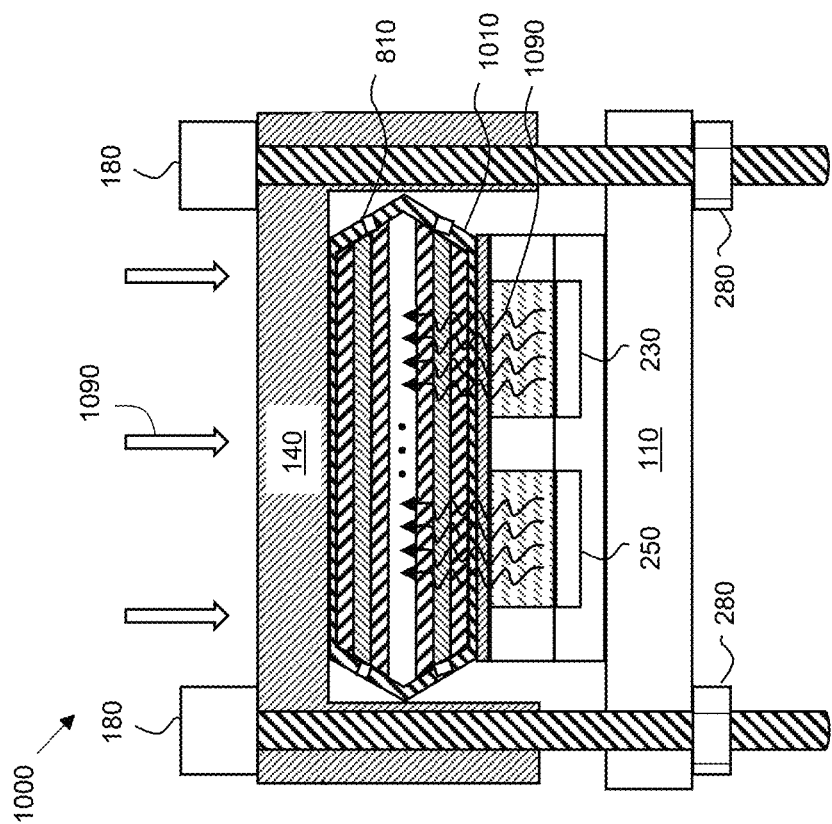
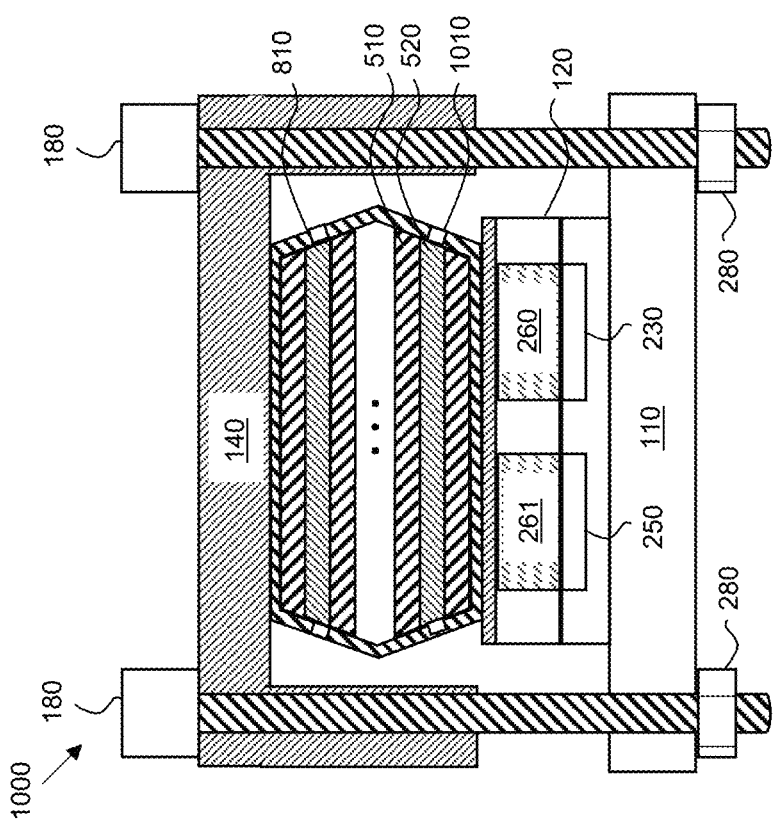

THERMAL INTERFACE STRUCTURES, ELECTRICAL SYSTEMS WITH THERMAL INTERFACE STRUCTURES, AND METHODS OF MANUFACTURE THEREOF

TECHNICAL FIELD

Embodiments of the subject matter described herein relate generally to thermal interface structures between heat-producing electrical components and heat sinks, and systems in which such structures are incorporated.

BACKGROUND

Many electronic devices include at least one heat-generating semiconductor die, which is physically coupled to a mounting surface of a device substrate. The semiconductor die(s) within an electronic device may be prone to excess heat generation during operation, particularly when operated at higher frequencies or when the die(s) are fabricated utilizing a power dense die technology. If not adequately dissipated, such excess heat can accumulate within the electronic device and limit performance of the semiconductor die(s) contained therein. Accordingly, thermal dissipation structures may be utilized to remove excess heat during operation of an electronic device.

Traditionally, thermal dissipation structures have been employed to direct excess heat generated by the semiconductor die(s) away from the die(s). To radiate the excess heat to the air, a system-level heatsink external to the electronic device may be coupled to the thermal dissipation structure. Typically, the heatsink is coupled to a surface of the electronic device with a thermal interface material (TIM) disposed between the electronic device and the heatsink. Conventional TIMs are generally adequate when there is little need to adjust for mechanical tolerances between an electronic device and a system-level heat sink. However, such conventional TIMs are not as efficient when significant mechanical tolerance adjustments are needed.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 4A and 4B are top and bottom views, respectively, of the power amplifier module of FIG. 2A or 2B with encapsulation and a conductive bottom layer, in accordance with an example embodiment;

FIGS. 5A, 5B, 5C, 5D, 5E, and 5F are cross-sectional, side views of six embodiments of "uncontained" composite thermal interface structures;

FIGS. 8A, 8B, 8C, and 8D are cross-sectional, side views of four embodiments of "contained" composite thermal interface structures;

FIGS. 10A and 10B are cross-sectional, side views of an electrical system with a first embodiment of a contained composite thermal interface structure at stages before and after applying a clamping force to the system, in accordance with an embodiment;

DETAILED DESCRIPTION

As mentioned above, conventional thermal interface materials (TIMs) often are inadequate in systems in which there is need to adjust for mechanical tolerances between an electronic component and a system-level heat sink. Most conventional systems utilize a "single-TIM" thermal management solution, in which either a single "compliant" TIM or a single "stiff" TIM is utilized between an electronic component and a system heat sink. Generally, compliant TIMs (e.g., thermal grease) are desirable in applications in which adjustments for mechanical tolerances are needed. However, compliant TIMs tend to have a relatively low thermal conductivity, and thus may be unsuitable for applications in which an electronic component produces very high levels of heat. Conversely, stiff TIMs (e.g., graphite sheets) may have very high thermal conductivity when the material thickness is low, but the thermal conductivity decreases dramatically as the stiff TIM thickness increases.

The various embodiments described herein overcome these disadvantages of conventional TIMs by providing a "composite" thermal interface structure for transferring heat from an electronic component to a system heat sink. As will be described in detail below, embodiments of composite thermal interface structures include one or more layers of stiff TIM, and one or more layers of compliant TIM assembled together in a stack (referred to below as a "TIM stack"). In some embodiments, the TIM stack also may include one or more shape memory alloy layers within or in contact with layer(s) of the compliant thermal interface material. In still other embodiments, the TIM stack may be at least partially surrounded by a collapsible encasement. By utilizing both compliant and stiff TIM materials, the composite thermal interface structures disclosed herein may be designed to be relatively thick, which is particularly suitable in applications in which mechanical tolerance adjustments are desired, while still being characterized as having higher thermal conductivities than are achievable using conventional single-TIM solutions.

Before describing specific embodiments of composite thermal interface structures, an example of a system and an electronic component with which such embodiments may be used will be described in conjunction with FIGS. 1, 2A, 2B, 3, 4A, and 4B. Although a specific example system and electronic component are illustrated and described herein, those of skill in the art would understand, based on the description herein, that the composite thermal interface structure embodiments described herein may be used in a variety of other types of systems and with a plethora of other types of electronic components. Accordingly, the specific example system and electronic component described herein are not meant to limit the application or use of the various composite thermal interface structure embodiments described herein.

Figure 1:
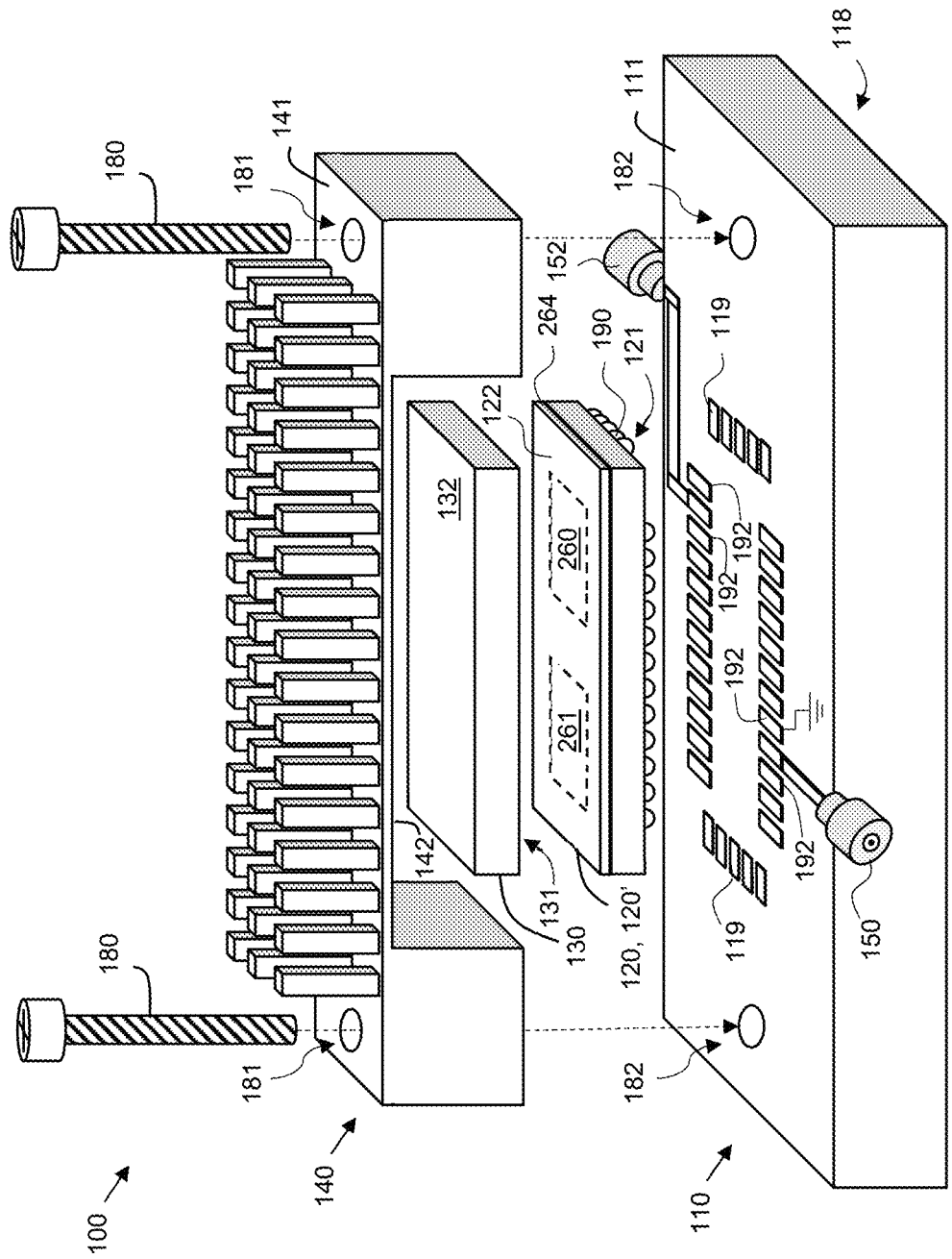
FIG. 1 is an exploded view of an electrical system that includes a system substrate, a heat-producing electronic component, a composite thermal interface structure, and a heat sink, in accordance with an example embodiment.
Figure 2A:
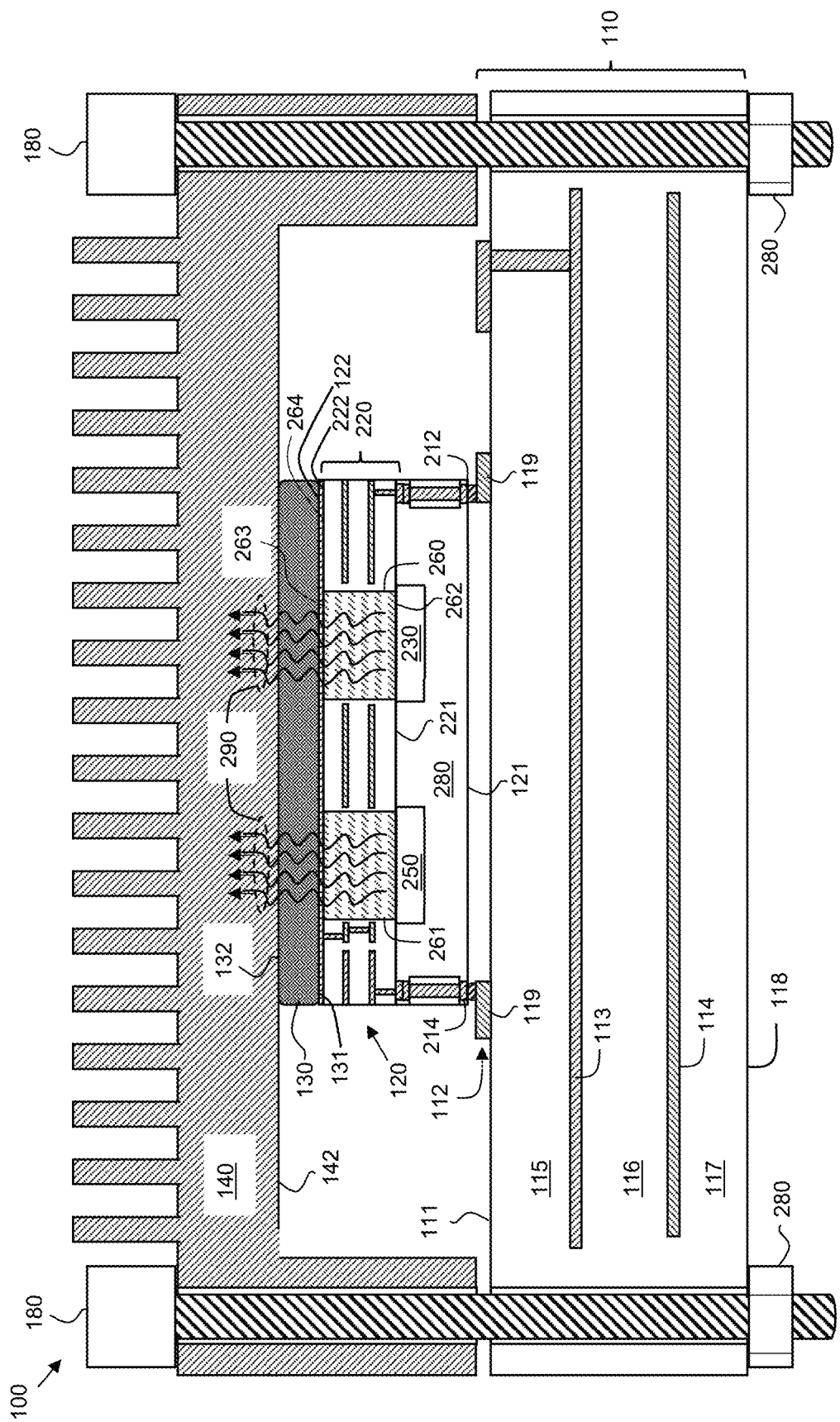
FIGS. 2A and 2B are cross-sectional, side views of assembled versions of the electrical system of FIG. 1, in accordance with two example embodiments.
Figure 2B:
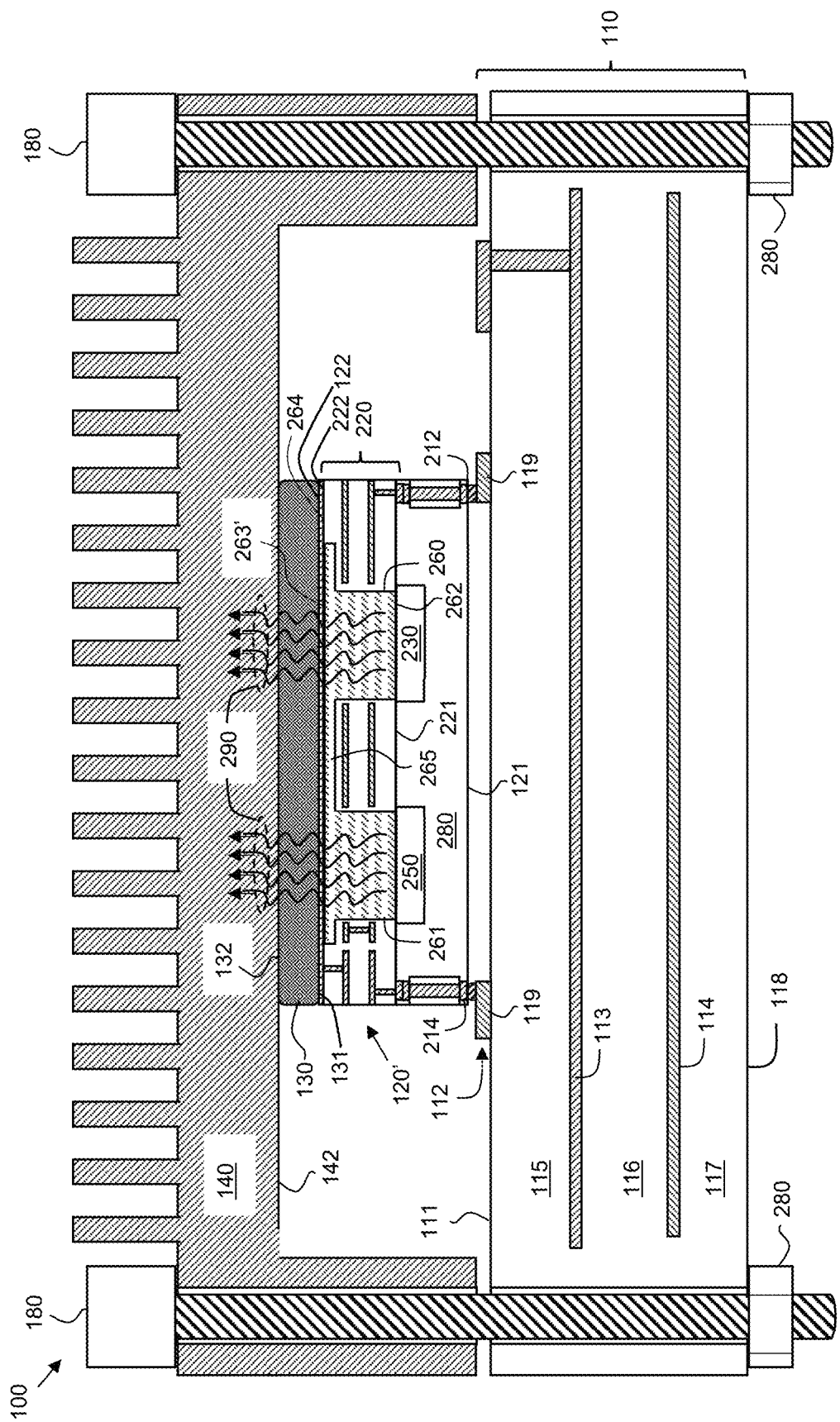

Starting with FIGS. 1, 2A, and 2B, which are best viewed simultaneously, an exploded view and side-cross sectional side views of an electrical system 100 are shown, respectively. The system 100 includes a system substrate 110, an electronic component 120 (FIG. 2A) or 120' (FIG. 2B), an embodiment of a composite thermal interface structure 130, and a system heat sink 140, in accordance with an example embodiment. It should be noted that the difference between the embodiments of FIGS. 2A and 2B relates only to differences in the composition of a thermally-conductive structure within electronic components 120, 120', which differences are described in detail, below.

The system substrate 110 may include, for example, a printed circuit board (PCB) or other suitable substrate for supporting and electrically interconnecting a plurality of electrical components. In the illustrated embodiment, the system substrate has a mounting surface 111, a back surface 118, and multiple external and internal patterned conductive layers 112, 113, 114 (FIGS. 2A, 2B) separated by one or more dielectric layers 115, 116, 117 (FIGS. 2A, 2B). Conductive vias (not numbered) that extend through the dielectric layers 115-117 may electrically interconnect the patterned conductive layers 112-114. A patterned conductive layer 112 on the mounting surface 111 may include a plurality of conductive features, including a plurality of terminal pads 119 and a plurality of conductive traces (not numbered), which provide electrical connections between the terminal pads 119 and various components and connectors (e.g., RF input and output connectors 150, 152) that may be mounted to the mounting surface 111. According to an embodiment, some of the terminal pads 119 may be "ground" pads 192, which are electrically connected to a ground layer or other ground feature within the system substrate 110, as indicated with the circuit depiction of ground attached to one such ground pad 192 in FIG. 1.

The electronic component 120, 120' may contain a wide variety of different types of electrical circuits. Some of these electrical circuits may include semiconductor dies that produce significant amounts of heat during operation, which may be dissipated as described in more detail below. As illustrated in both FIGS. 2A and 2B, and according to an embodiment, the electronic component 120, 120' is defined by a terminal surface 121 and an opposite thermal interface surface 122, and may include a module substrate 220, one or more heat-producing semiconductor dies 230, 250, a plurality of terminals 212, 214, and encapsulation material 280 or other packaging. In various embodiments, the electronic component 120, 120' may be a flat-no-leads type of package (e.g., a dual flat-no-leads (DFN) or quad flat-no-leads (QFN) package), a land grid array (LGA) package, a pin grid array (PGA) package, a ball grid array (BGA) package, or another type of package that includes different types of terminals (e.g., gull-wing or other types of terminals extending from the sides of the electronic component 120, 120').

According to an embodiment, the module substrate 220 may be a small PCB or other type of substrate suitable for mounting electronic components. As such, the module substrate 220 has a component mounting surface 221, an opposite thermal interface surface 222, and one or more external and internal patterned conductive layers (not numbered) separated by one or more dielectric layers (not numbered). Conductive vias (not numbered) that extend through the dielectric layers may electrically interconnect the patterned conductive layers.

In the embodiment illustrated in FIG. 2A, one or more thermally-conductive structures 260, 261 (e.g., metal coins) are embedded within the module substrate 220, and the thermally-conductive structures 260, 261 extend between the mounting surface 221 and the thermal interface surface 222. As used herein, the term "thermally-conductive" is defined as having a thermal conductivity exceeding 10 W/mk. Each thermally-conductive structure 260, 261 may have a first surface 262 that is substantially co-planar with the mounting surface 221 of the module substrate 220, and a second surface 263 (or "thermal interface surface") that is substantially co-planar with the thermal interface surface 222 of the module substrate 220. According to various embodiments, the thermally-conductive structures 260, 261 may include conductive metal coins (e.g., plated or un-plated copper coins or other metallic coins), conductive thermal vias, or other suitable structures. In the illustrated embodiment, each thermally-conductive structure 260, 261 contacts a single semiconductor die 230, 250. In some other embodiments, a thermally-conductive structure may contact more than one semiconductor die. For example, FIG. 2B depicts an alternate embodiment of an electronic component 120', which includes a thermally-conductive structure that includes multiple coins 260, 261, each of which contacts a different semiconductor die, and a thermally-conductive coupling member 265 at the thermal interface surface 222 that connects the multiple coins. The multiple coins 260, 261 and the thermally-conductive coupling member 265 may together be formed from a solid body of thermally-conductive material, and an exterior surface 263' (or "thermal interface surface") of the thermally-conductive coupling member 265 is substantially co-planar with the thermal interface surface 222 of the module substrate 220.

An optional conductive layer 264 (e.g., a copper layer) may overlie the thermal interface surface 222 of the module substrate 220 and the second surface 263 of each thermally-conductive structure 260, 261, or may overlie the exterior surface 263' of the thermally-conductive coupling member 265, in various embodiments. When included, the conductive layer 264 defines the thermal interface surface 122 of the electronic component 120, 120'. When the conductive layer 264 is excluded, the thermal interface surface 222 of the module substrate 220 and the second surface(s) 263, 263' of the thermally-conductive structures 260, 261 or the thermally-conductive coupling member 265 define the thermal interface surface 122 of the electronic component 120, 120'.

Each heat-producing semiconductor die 230, 250 is coupled to the mounting surface 221 of the module substrate 220, and more particularly each die 230, 250 is at least partially bonded (e.g., soldered, brazed, sintered, or otherwise attached) to the first surface 262 of a thermally-conductive structure 260, 261. According to an embodiment, a plurality of component terminals 212, 214 also are coupled to the mounting surface 221 of the module substrate 220, extending to a height that exceeds the height(s) of the semiconductor die(s) 230, 250. The semiconductor dies 230, 250, component terminals 212, 214, and mounting surface 221 of the module substrate 220 may be overmolded with encapsulant material 280, or may otherwise be packaged (e.g., in an air cavity package) to produce a discrete electronic component 120, 120'.

The electronic component 120, 120' may be physically and electrically coupled to the system substrate 110 by aligning the component terminals 212, 212 with corresponding terminal pads 119 on the mounting surface 112 of the system substrate 110, and connecting the respective terminals 212, 214 and terminal pads 119 using conductive attachment material 190 (e.g., solder, solder paste, conductive adhesive, or other suitable attachment material). During operation of the system 100, the electronic component 120, 120' may receive power and bias voltages, connect with ground references, receive and/or convey information-bearing signals, receive and/or convey control signals, and otherwise electrically interact with portions of the electrical system that are external to the electronic component 120, 120' through the terminals 212, 214, terminal pads 119, and conductive traces (not illustrated) on or within the system substrate 110.

System operation may cause the semiconductor die(s) 230, 250 to produce excess heat, indicated by arrows 290 (FIGS. 2A, 2B), which is drawn away from the semiconductor die(s) 230, 250 and the electronic component 120, 120' through a heat removal system. The heat removal system includes the thermally-conductive structures 260, 261, an embodiment of the composite thermal interface structure 130, and the system heat sink 140. According to an embodiment, the composite thermal interface structure 130 has a first surface 131 that couples to or contacts the thermal interface surface 122 of the electronic component 120, 120', and a second surface 132 that couples to or contacts a lower surface 142 of the system heat sink 140.

The system heat sink 140 may include, for example, a metal chassis, a fin structure (e.g., a pin-fin array), or another thermally-conductive body. According to an embodiment, the system heat sink 140 may include an opening that fits over the composite thermal interface structure 130 and the electronic component 120, 120'. After alignment of the opening in the system heat sink 140 with the thermal interface structure 130 and the electronic component 120, 120', the system heat sink 140 may be connected and secured to the system substrate 110 with a securement mechanism. For example, as illustrated in FIGS. 1, 2A, and 2B, the securement mechanism may include screws 180, which are inserted through holes 181 between the upper and lower surfaces 141, 142 of the system heat sink 140, and into or through holes 182 in the system substrate 110. The screws 180 may be tightened, for example, using nuts 280 at the back surface 118 of the system substrate 110 in order to provide a clamping force to compress the composite thermal interface structure 130 between the electronic component 120, 120' and the system heat sink 140. In other embodiments, other types of securement mechanisms may be used to provide the clamping force, including clips, clamps, or other mechanisms.

Figure 3:
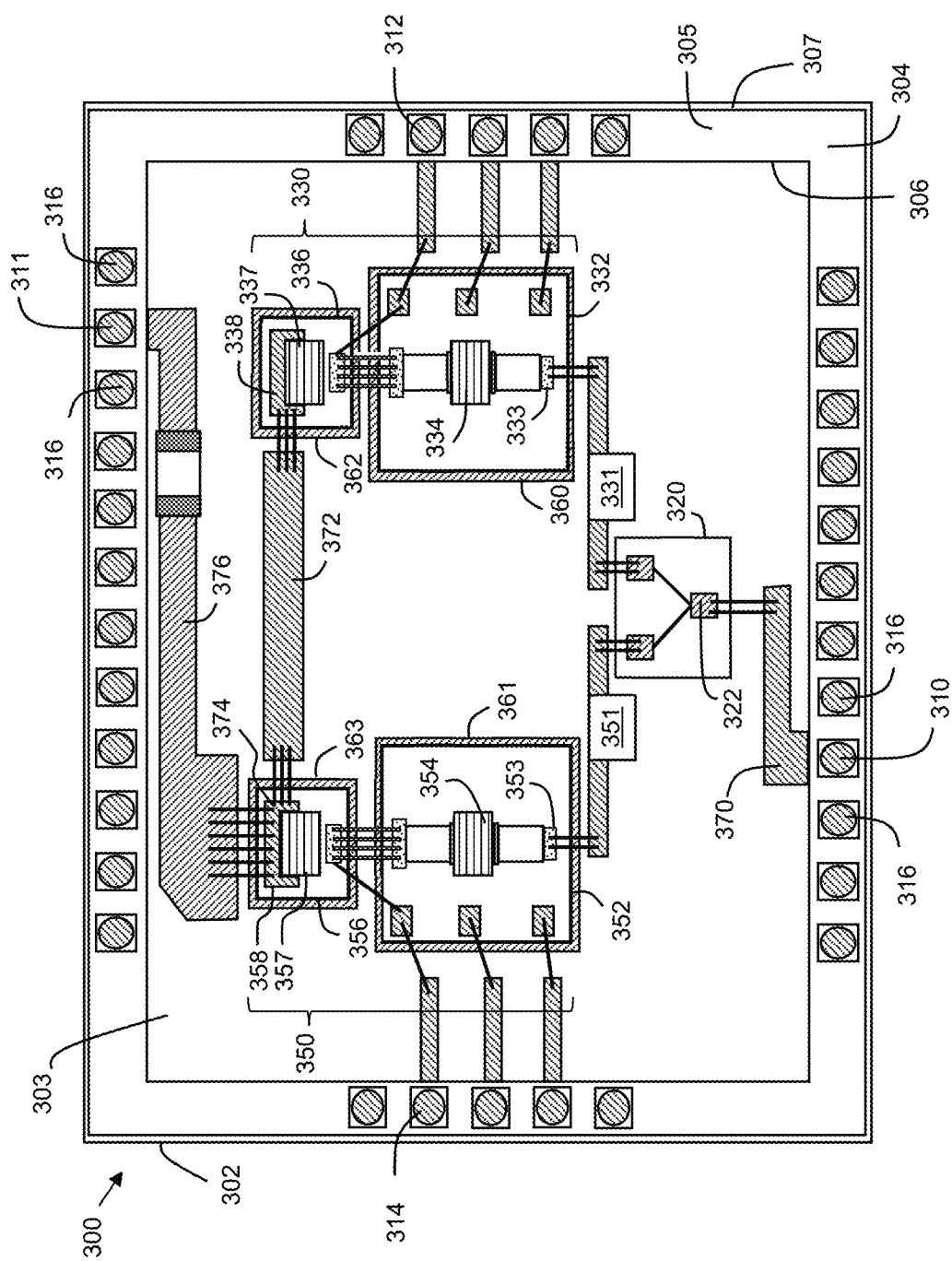
FIG. 3 is a top view of an electronic component in the form of a power amplifier module with encapsulation removed, in accordance with an example embodiment.

As mentioned above, the electronic component 120, 120' may take any of a variety of forms. To enhance understanding of the inventive concepts, an example of an electronic component 120, 120' that embodies a power amplifier module (PAM) will now be described in conjunction with FIG. 3. More specifically, FIG. 3 is a top view of a PAM 300, in accordance with an example embodiment. The PAM 300 of FIG. 3 is shown without encapsulation (e.g., encapsulation 480, FIG. 4A) so as not to obfuscate the internal components of the PAM 300. FIG. 3 should be viewed simultaneously with FIGS. 4A and 4B, which illustrate a top view of the PAM 300 of FIG. 3 with encapsulation 480 overlying the internal components of the PAM 300 (FIG. 4A), and a bottom view of the PAM 300 with a conductive bottom layer 464 (FIG. 4B), in accordance with an example embodiment.

The PAM embodiments described herein may be utilized to implement any of a variety of different types of power amplifiers. To provide a concrete example, a Doherty power amplifier module is illustrated and described herein. However, those of skill in the art will understand, based on the description herein, that the inventive subject matter may be utilized in PAMs that implement other types of amplifiers, as well, and/or in electronic circuit modules or electronic devices other than power amplifier modules. Accordingly, the use of a Doherty power amplifier module in the example embodiments below is not meant to limit application of the inventive subject matter only to Doherty power amplifier modules, and the inventive subject matter may be used in other types of power amplifier modules, electronic circuit modules, or electronic devices, as well.

Turning first to FIG. 3, PAM 300 (e.g., device 120, 120', FIGS. 1, 2A, 2B) includes a Doherty power amplifier implemented with a module substrate 302 (e.g., module substrate 220, FIGS. 2A, 2B) and a plurality of power transistor dies 332, 336, 352, 356 and other electrical components. In addition, PAM 300 includes a terminal interposer 304, which includes a plurality of terminals (e.g., terminals 310, 311, 312, 314, 316) for electrically connecting the internal components of PAM 300 with corresponding terminal pads (e.g., terminal pads 119, 192, FIGS. 1, 2A, 2B) of a system substrate (e.g., substrate 110, FIGS. 1, 2A, 2B). As mentioned above, those terminal pads, in turn, may be coupled to connectors (e.g., connectors 150, 152, FIG. 1) and external circuitry, including external circuitry configured to produce or consume information bearing signals, external circuitry that provides bias voltages, and external circuitry that provides connections to ground references, as will be discussed in detail below.

Module substrate 302 may be in the form of a multiple-layer printed circuit board (PCB) or other suitable substrate, according to an embodiment. The module substrate 302 has a top surface 303 (also referred to as a "front-side" or "mounting surface") and a bottom surface 422 (analogous to surfaces 122, 222, FIGS. 2A, 2B) (also referred to as a "back-side" or "thermal interface surface"). As will be described in more detail below, a plurality of components and the terminal interposer 304 are coupled to the mounting surface 303 of the module substrate 302, and non-conductive encapsulant material 480 (FIG. 4A, e.g., a plastic encapsulant) is disposed on the mounting surface 303 and over and around the components and interposer 304 to define a top surface 421 (FIG. 4A, e.g., surface 121, FIGS. 1, 2A, 2B, also referred to as a "terminal surface") of the module 300. According to an embodiment, the encapsulant material 480 has a thickness that is greater than the maximum height of the components that are covered by the encapsulant material 480. In some embodiments, the thickness of the encapsulant material 480 is equal to or about equal to the height of the interposer 304 above the mounting surface 303, although the thickness of the encapsulant material 480 may be slightly less or greater than the height of the interposer 304, in other embodiments.

The terminal interposer 304 is a distinct component coupled to the mounting surface 303 of the module substrate 302, and may include a solid or layered dielectric body through which a plurality of terminals (e.g., terminals 310, 311, 312, 314, 316) extend. In the illustrated example, the dielectric body of interposer 304 has a rectangular shape with an interior opening, so that the interposer 304 has an outer perimeter or exterior side 307 that substantially corresponds to the perimeter of the PAM 300, and an inner perimeter or interior side 306 that defines an opening within which the dies 332, 336, 352, 356 and other components are mounted to the mounting surface 303 of the module substrate 302. In other embodiments, the terminal interposer 304 may be composed of multiple, discrete interposers (e.g., a plurality of linear interposers, each of which is aligned with a side of the PAM 300). In addition, the terminals (e.g., terminals 310, 311, 312, 314, 316) may have sidewalls that are fully embedded within the dielectric body of interposer 304, as illustrated, or a sidewall of each terminal may be exposed at a side of the PAM 300. Either way, terminal interposer 304 configures PAM 300 essentially as a quad flat no-leads (QFN) device. In other embodiments, PAM 300 may be configured as a dual flat no-leads (DFN) device, or the terminals of PAM 300 may have other configurations (e.g., PAM 300 may be configured as a land grid array (LGA), a pin grid array (PGA), a ball grid array (BGA), or may include leads (e.g., gull-wing leads) extending from the sides of PAM 300).

The terminal interposer 304 is defined by a lower (or "proximal") surface (not numbered), an upper (or "distal") surface 305, the interior side 306, and the exterior side 307. The lower surface of the interposer 304, and more particularly proximal ends of the terminals (e.g., terminals 310, 311, 312, 314, 316) embedded within the dielectric body of the interposer 304, are coupled to conductive features (e.g., pads and traces) on the mounting surface 303 of the module substrate 302. Referring also to FIG. 4A, the upper surface 305 of the interposer 304, and more particularly distal ends of the terminals, are exposed at a terminal surface 421 of the PAM 300, which is defined by the top surface of the encapsulant material 480. To assemble the PAM 300 with a system substrate (e.g., system substrate 110, FIGS. 1, 2A, 2B), conductive attachment material (e.g., conductive attachment material 190, FIG. 1, such as solder balls, solder paste, or conductive adhesive) is disposed on the exposed distal ends of the terminals to facilitate electrical and mechanical attachment of the PAM 300 to terminal pads (e.g., pads 119, 192, FIG. 1) of the system substrate. A reflow, curing, brazing, or sintering process may be performed to complete the attachment of the PAM 300 with the system substrate.

According to an embodiment, the module substrate 302 includes a plurality of dielectric layers (e.g., as shown in FIGS. 2A, 2B in substrate 220, and formed from FR-4, ceramic, or other PCB dielectric materials), in an alternating arrangement with a plurality of conductive layers (e.g., as also shown in FIGS. 2A, 2B in substrate 220), where a top surface 303 of the module substrate 302 is defined by a top patterned conductive layer. As best shown in FIG. 4B, a bottom surface (e.g., surface 222, FIGS. 2A, 2B) of the module substrate 302 may be defined by or covered by another conductive layer 464 (e.g., layer 264, FIGS. 1, 2A, 2B). When included, and as indicated by the dashed-line depictions of thermally-conductive structures 360-363 (e.g., similar or identical to thermally-conductive structures 260, 261, FIG. 2A), the conductive layer 464 is connected to the thermal interface surfaces of the thermally-conductive structures 360-363 (e.g., thermal interface surfaces 263, FIG. 2A). In an alternate embodiment, the conductive layer 464 may be connected to the thermal interface surface of a thermally-conductive coupling member (e.g., thermal interface surface 263' of thermally-conductive coupling member 265, FIG. 2B).

Each of the various conductive layers of the module substrate 302 may have a primary purpose, and the module substrate 302 also may include conductive features (e.g., conductive vias) that facilitate signal and/or voltage/ground routing between the various conductive layers. For example, in an embodiment, the patterned "top" conductive layer at the mounting surface 303 of the module substrate 302 may primarily function as a signal conducting layer. More specifically, the top conductive layer includes a plurality of conductive features (e.g., conductive pads and traces) which serve as attachment points for dies 332, 336, 352, 356 and other discrete components, and also provide electrical connectivity between the dies 332, 336, 352, 356, terminals, and other discrete components. In addition, the top conductive layer may include a plurality of conductive pads that are specifically designated for attachment of electrically conductive signal, bias, and/or ground terminals (e.g., terminals 310, 311, 312, 314, 316) within interposer 304. The top conductive layer also may include a plurality of "dummy" pads to which "dummy" terminals may be attached (i.e., a terminal within interposer 304 that is not assigned any particular function in the amplifier, and is not coupled to any active circuitry). In various embodiments, the dummy terminals and dummy pads may be left electrically floating (i.e., not coupled to ground or other circuitry), or alternatively may be coupled to a ground layer. Other patterned conductive layers may function to connect to a ground reference, to convey bias voltages to power transistors 334, 337, 354, 357 within the dies 332, 336, 352, 356, and/or to provide signal routing.

According to an embodiment, module substrate 302 also includes one or more thermal dissipation structures 360, 361, 362, 363 (e.g., structures 260, 261, FIGS. 2A, 2B), which extend between the top and bottom surfaces of the module substrate 302, and which may, in some embodiments, be connected by a thermally-conductive coupling member (e.g., member 265, FIG. 2B). The dies 332, 336, 352, 356 are physically and electrically coupled to surfaces (e.g., surface 262, FIGS. 2A, 2B) of the thermal dissipation structures 360, 361, 362, 363 that are exposed at the top surface 303 of the module substrate 302. The bottom surfaces (e.g., surface 263, FIG. 2A) of the thermal dissipation structures 360-363 (or the bottom surface 263' of a thermally-conductive coupling member 265, FIG. 2B) may be exposed at the bottom surface (e.g., bottom surface 222, FIGS. 2A, 2B) of the module substrate 302, or, as best illustrated in FIG. 4B, the bottom surfaces of the thermal dissipation structures 360, 361, 362, 363 (or a thermally-conductive coupling member) may be covered with the bottom conductive layer 464, and as mentioned above. Either way, the thermal dissipation structures 360-363 are configured to provide a thermal pathway between the dies 332, 336, 352, 356 and the bottom surfaces of the thermal dissipation structures 360-363 (and thus the bottom surface of the module substrate 302). In various embodiments, the thermal dissipation structures 360-363 may include conductive metallic coins that are press-fit and/or attached in through-holes that extend between the top and bottom surfaces of the module substrate 302. As discussed previously, one or thermally-conductive coupling members (e.g., member 265, FIG. 2B) may electrically and thermally connect some or all of the thermal dissipation structures 360-363. In alternate embodiments, each of the thermal dissipation structures 360-363 may include a plurality (or set) of conductive thermal vias (e.g., circular or bar vias) that extend between the top and bottom surfaces of the module substrate 302. As was discussed above in conjunction with FIGS. 1, 2A, and 2B, the bottom surfaces of the thermal dissipation structures 360-363 (or the bottom surface(s) of the thermally-conductive coupling member or the portion of the conductive layer 464 overlying those surfaces) are physically and thermally coupled to an embodiment of a composite thermal interface structure (e.g., structure 130, FIGS. 1, 2A, 2B), which in turn is physically and thermally coupled to a system heat sink (e.g., heat sink 140, FIGS. 1, 2A, 2B) when the module 300 is integrated within a larger electrical system (e.g., system 100, FIGS. 1, 2A, 2B).

In the illustrated embodiment, PAM 300 houses a multiple-path power amplifier, and more specifically a Doherty power amplifier. Accordingly, PAM 300 further includes an RF signal input terminal 310, a power splitter 320, a two-stage, carrier amplifier 330, a two-stage peaking amplifier 350, various phase shift and impedance matching elements, a combining node 374, an output impedance matching network 376, and an RF signal output terminal 311. When incorporated into a larger electrical system (e.g., system 100, FIGS. 1, 2A, 2B), the RF signal input terminal 310 is configured to receive an RF input signal for amplification (e.g., through RF connector 150, FIG. 1, and additional circuitry, not illustrated), and the RF signal output terminal 311 is configured to produce an amplified RF output signal (e.g., which may be conveyed to RF connector 152, FIG. 1). Accordingly, terminal 310 functions as the RF signal input terminal for the PAM 300. According to an embodiment, terminal 310 is embedded within terminal interposer 304, as discussed above, and is coupled to an RF signal input pad at the mounting surface 303 of the module substrate 302. Through one or more conductive structures (e.g., vias, trace 370, and/or wirebonds, as shown), the RF signal input pad (and thus input terminal 310) is electrically coupled to an input 322 to the power splitter 320.

Similarly, terminal 311 functions as the RF signal output terminal for the PAM 300. According to an embodiment, terminal 311 is embedded within terminal interposer 304, and is coupled to an RF signal output pad at the mounting surface 303 of the module substrate 302. Through one or more conductive structures (e.g., vias, traces, and/or wirebonds), the RF signal output pad is electrically coupled to the combining node 372 (through network 376).

According to an embodiment, ground terminals 316 also are embedded within terminal interposer 304 "next to" and "in close proximity" to RF input and output terminals 310, 311 in order to provide GSG (ground-signal-ground) terminal structures for the RF input and for the RF output of the PAM 300. For example, and according to an embodiment, the ground terminals 316 within the interposer 304 may be positioned on either side of each of the RF input and output terminals 310, 311, and each of the ground terminals 316 may be coupled to grounded pads (e.g., pads 192, FIG. 1) of a system substrate (e.g., substrate 110, FIGS. 1, 2A, 2B). By implementing GSG terminal structures for the RF input and for the RF output of the module 300, the length of the return current loop associated with the terminal structure may be very short. In addition, radiated electromagnetic energy from the RF input and output terminals 310, 311 may be terminated to ground by the proximate ground terminals 316, which avoids potential performance issues that may otherwise occur if the radiated electromagnetic energy were permitted to reach other portions of the module.

The power splitter 320, which is coupled to the mounting surface 303 of the system substrate 302, may include one or more discrete die and/or components, although it is represented in FIG. 3 as a single element. The power splitter 320 includes an input terminal 322 and two output terminals (not numbered). The input terminal 322 is electrically coupled through one or more conductive structures (e.g., vias, traces, and/or wirebonds, as shown) to the RF signal input pad and to the RF signal input terminal 310, and thus is configured to receive an input RF signal. The output terminals of the power splitter 320 are electrically coupled through one or more conductive structures (e.g., vias, traces, and/or wirebonds) and input circuits 331, 351 to inputs 333, 353 for the carrier and peaking amplifiers 330, 350, respectively.

The power splitter 320 is configured to split the power of the input RF signal received through the RF input terminal 310 into first and second RF signals, which are produced at the output terminals of the power splitter 320. In addition, the power splitter 320 may include one or more phase shift elements configured to impart about a 90 degree phase difference between the RF signals provided at the splitter output terminals. The first and second RF signals produced at the outputs of the power splitter 320 may have equal or unequal power. The first RF signal produced by the power splitter 320 is amplified through the carrier amplifier path 330, and the second RF signal produced by the power splitter 320 is amplified through the peaking amplifier path 350.

In the specific embodiment of FIG. 3, each of the carrier and peaking amplifier paths includes a two-stage power amplifier 330, 350, where a driver-stage transistor 334, 354 is implemented on a driver-stage die 332, 352, and a final-stage transistor 337, 357 is implemented on a separate final-stage die 336, 356. For example, each of the transistors 334, 337, 354, 357 may be field effect transistors (FETs), such as laterally-diffused metal oxide semiconductor (LDMOS) FETs or high electron mobility transistors (HEMTs). The description may refer to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations that utilize FET devices, and instead are meant to apply also to implementations that utilize bipolar junction transistors (BJT) devices or other suitable types of transistors.

The carrier amplifier 330 more specifically includes a silicon or silicon germanium (SiGe) driver-stage die 332 and a gallium nitride (GaN) final-stage die 336, and the peaking amplifier 350 also includes a silicon or SiGe driver-stage die 352 and a GaN final-stage die 356, in accordance with an example embodiment. In other embodiments, each of the carrier and peaking amplifiers 330, 350 may include a two-stage power amplifier implemented on a single die, or each of the carrier and peaking amplifiers 330, 350 may include a single-stage power amplifier implemented on a single die. In still other embodiments, each of the carrier and peaking amplifiers may include a two-stage power amplifier implemented on separate driver and final-stage dies, but the driver and final-stage dies may be formed using the same semiconductor technology (e.g., both the driver and final-stage dies are silicon dies, SiGe dies, or GaN dies), or the driver and/or final-stage dies may be formed using different semiconductor technologies than those described above (e.g., the driver and/or final-stage dies may be formed from a gallium arsenide (GaAs) die or a die of another suitable semiconductor material).

The carrier amplifier path includes the above-mentioned driver stage die 332, the final-stage die 336, and a phase shift and impedance inversion element 372. The driver stage die 332 and the final-stage die 336 of the carrier amplifier path 330 are electrically coupled together in a cascade arrangement between an input terminal 333 of the driver stage die 332 (corresponding to a carrier amplifier input) and an output terminal 338 of the final-stage die 336 (corresponding to a carrier amplifier output).

The driver stage die 332 includes a plurality of integrated circuits. In an embodiment, the integrated circuitry of die 332 includes a series-coupled arrangement of the input terminal 333, an input impedance matching circuit (not numbered), a silicon or SiGe power transistor 334, an integrated portion of an interstage impedance matching circuit (not numbered), and an output terminal (not numbered), in an embodiment. More specifically, the gate of the transistor 334 is electrically coupled through the input impedance matching circuit to the input terminal 333, and the drain of the transistor 337 is electrically coupled through the output impedance matching circuit to the output terminal of die 332. The source of transistor 334 is electrically coupled to a conductive layer (or source terminal) on a bottom surface of die 332, and the bottom conductive layer is physically, electrically, and thermally coupled to the exposed top surface of a thermal dissipation structure 360.

The output terminal of the driver stage die 332 is electrically coupled to the input terminal of the final-stage die 336 through a wirebond array (not numbered) or another type of electrical connection. The final-stage die 336 also includes a plurality of integrated circuits. In an embodiment, the integrated circuitry of die 336 includes a series-coupled arrangement of an input terminal (not numbered), a GaN power transistor 337, and an output terminal 338. More specifically, the gate of the transistor 337 is electrically coupled to the input terminal of die 336, and the drain of the transistor 337 is electrically coupled to the output terminal 338 of die 336. The source of transistor 337 is electrically coupled to a conductive layer on a bottom surface of die 336, and the bottom conductive layer is physically, electrically, and thermally coupled to the exposed top surface of a thermal dissipation structure 362.

The peaking amplifier path includes the above-mentioned driver stage die 352 and the final-stage die 356. The driver stage die 352 and the final-stage die 356 of the peaking amplifier path 350 are electrically coupled together in a cascade arrangement between an input terminal 353 of the driver stage die 352 (corresponding to a peaking amplifier input) and an output terminal 358 of the final-stage die 356 (corresponding to a peaking amplifier output).

The driver stage die 352 includes a plurality of integrated circuits. In an embodiment, the integrated circuitry of die 352 includes a series-coupled arrangement of the input terminal 353, an input impedance matching circuit (not numbered), a silicon or SiGe power transistor 354, an integrated portion of an interstage impedance matching circuit (not numbered), and an output terminal (not numbered), in an embodiment. More specifically, the gate of the transistor 354 is electrically coupled through the input impedance matching circuit to the input terminal 353, and the drain of the transistor 354 is electrically coupled through the output impedance matching circuit to the output terminal of die 352. The source of transistor 354 is electrically coupled to a conductive layer on a bottom surface of die 352, and the bottom conductive layer is physically, electrically, and thermally coupled to the exposed top surface of a thermal dissipation structure 361.

The output terminal of the driver stage die 352 is electrically coupled to the input terminal of the final-stage die 356 through a wirebond array (not numbered) or another type of electrical connection. The final-stage die 356 also includes a plurality of integrated circuits. In an embodiment, the integrated circuitry of die 356 includes a series-coupled arrangement of an input terminal (not numbered), a GaN power transistor 357, and an output terminal 358. More specifically, the gate of the transistor 357 is electrically coupled to the input terminal of die 356, and the drain of the transistor 357 is electrically coupled to the output terminal 358 of die 356. The source of transistor 357 is electrically coupled to a conductive layer on a bottom surface of die 356, and the bottom conductive layer is physically, electrically, and thermally coupled to the exposed top surface of a thermal dissipation structure 363. It should be noted at this juncture that, although the PAM 300 illustrated in FIG. 3 includes a distinct thermal dissipation structure 360-363 for each die 332, 336, 352, 356, in other embodiments, multiple dies may be coupled to a same thermal dissipation structure. For example, the bottom conductive layers of dies 332, 336 may be coupled to a first thermal dissipation structure, and the bottom conductive layers of dies 352, 356 may be coupled to a second thermal dissipation structure. Alternatively, other combinations of multiple ones of the dies 332, 336, 352, 356 may be coupled to common thermal dissipation structure(s).

For proper Doherty operation, the carrier amplifier 330 may be biased to operate in a class AB mode, and the peaking amplifier 350 may be biased to operate in a class C mode. To accomplish this biasing, a plurality of gate and drain bias voltages may be provided by external bias voltage sources. According to an embodiment, the bias voltages are provided through bias terminals (e.g., terminals 312, 314) of the terminal interposer 304. More specifically, gate bias voltages for driver-stage transistors 334, 354 may be provided through driver gate bias terminals (not numbered), drain bias voltages for driver-stage transistors 334, 354 may be provided through driver drain bias terminals (not numbered), and gate bias voltages for final-stage transistors 337, 357 may be provided through gate bias terminals 312, 314. Each of the bias terminals has a proximal end coupled to conductive structures (e.g., pads and traces) of the top conductive layer of module substrate 302, and the conductive structures are electrically coupled (e.g., through wirebonds, as shown) to bias pads on the driver- and/or final-stage dies. In the illustrated embodiment, the gate and drain bias pads for both the driver- and final-stage transistors 334, 337, 354, 357 are located on the driver-stage dies 332, 352, and the gate bias voltage for the final-stage dies 336, 356 "hops" from the driver-stage dies 332, 352 to the final-stage dies 336, 356 through wirebond connections, as shown.

Returning again to the operation of PAM 300, an amplified carrier signal is produced at the output terminal 338 of the carrier final-stage die 336, and an amplified peaking signal is produced at the output terminal 358 of the peaking final-stage die 356. According to an embodiment, output terminal 358 also functions as a combining node 374 for the amplifier. The output terminal 338 of the carrier final-stage die 336 is electrically coupled (e.g., through wirebonds (not numbered) or another type of electrical connection) to a first end of the phase shift and impedance inversion element 372, and the output terminal 358 of the peaking final-stage die 356 is electrically coupled (e.g., through wirebonds (not numbered) or another type of electrical connection) to a second end of the phase shift and impedance inversion element 372.

According to an embodiment, the phase shift and impedance inversion element 372 may be implemented with a quarter-wavelength or lambda/4 (λ/4) or shorter transmission line (e.g., a microstrip transmission line with an electrical length up to about 90 degrees) that is formed from a portion of the top conductive layer of the module substrate 302. As used herein, lambda is the wavelength of an RF signal at the fundamental frequency of operation of the amplifier (e.g., a frequency in a range of about 600 megahertz (MHz) to about 10 gigahertz (GHz) or higher). The combination of the phase shift and impedance inversion element 372 and the wirebond (or other) connections to the output terminals 338, 358 of dies 336, 356 may impart about a 90 degree relative phase shift to the amplified carrier signal as the signal travels from output terminal 338 to output terminal 358/combining node 374. When the various phase shifts imparted separately on the carrier and peaking RF signals through the carrier and peaking paths, respectively, are substantially equal, the amplified carrier and peaking RF signals combine substantially in phase at output terminal 358/combining node 374.

The output terminal 358/combining node 374 is electrically coupled (e.g., through wirebonds or another type of electrical connection) through an output impedance matching network 376 to RF output terminal 311. The output impedance matching network 376 functions to present the proper load impedances to each of carrier and peaking final-stage dies 336, 356. Although shown in a highly simplified form in FIG. 3, the output impedance matching network 376 may include various conductive traces, additional discrete components (e.g., capacitors, inductors, and/or resistors) between output terminal 358/combining node 374 and RF output terminal 311, which provide the desired impedance matching. As mentioned above and according to an embodiment, RF output terminal 311 and ground terminals 316 are embedded within terminal interposer 304, and the ground terminals 316 are positioned next to RF output terminal 311 in order to provide a GSG terminal structure for the RF output of the PAM 300.

As discussed above in conjunction with FIGS. 1, 2A. and 2B, when an electronic component (e.g., component 120, 120', and/or PAM 300, FIGS. 1-3) is incorporated into a larger electronic system and system operation commences, semiconductor die(s) (e.g., dies 230, 250, 332, 336, 352, 356, FIGS. 1-3) may produce excess heat, which is drawn away from the semiconductor die(s) and the electronic component or module through a heat removal system. According to various embodiments, the heat removal system includes thermally-conductive structures of the electronic component (e.g., structures 260, 261, 265, 360-363, FIGS. 1-3), an embodiment of a composite thermal interface structure (e.g., thermal interface structure 130, FIGS. 1, 2A, 2B), and a system heat sink (e.g., heat sink 140, FIGS. 1, 2A, 2B). As also discussed above, the composite thermal interface structure (e.g., structure 130, FIGS. 1, 2A, 2B) has a first surface (e.g., surface 131) that couples to or contacts the thermal interface surface (e.g., surface 122) of the electronic component or module, and a second surface (e.g., surface 132) that couples to or contacts a surface (e.g., surface 142) of the system heat sink.

Various embodiments of thermal interface structures for transferring heat from an electronic component to a system heat sink now will be described in conjunction with FIGS. 5-11. As will be described in detail, each of the various thermal interface structure embodiments includes one or more layers of a "stiff" thermal interface material ("stiff TIM layer(s)", such as layers 510, FIGS. 5-11), and one or more layers of a "compliant" thermal interface material ("compliant TIM layer(s)", such as layers 520, FIGS. 5-11) assembled together in a stack.

As used herein, the term "stiff," in the context of a thermal interface material, means that the material is a solid, sometimes flexible material that is resistant to undergoing fluid movement in response to the application of a force. For example, the stiff thermal interface material(s) used herein may have a hardness (Shore 00 or Shore 000) greater than about 30 (e.g., a hardness in a range of about 30 to about 100 or more), and a relatively high Young's modulus' of elasticity. According to various embodiments described below, the stiff thermal interface material(s) may have an XY-plane thermal conductivity in a range from about 50 watts per meter Kelvin (W/mK) to about 1700 W/mK, and a Z-axis thermal conductivity in a range from about 1 W/mK to about 450 W/mK According to various embodiments, the material(s) for the stiff TIM layers (e.g., layers 510, FIGS. 5-11) may be selected from pyrolytic graphite sheet (PGS) material, black lead sheet material, electrically conductive graphite sheet material, thermally conductive foil (e.g., indium foil, copper foil, and so on), silicone sheet material, non-silicon resin sheet material, thermally-conductive gel pad, silver foil, silver sinter film, or other suitable materials.

As used herein, the term "compliant," in the context of a thermal interface material, means that the material is a high deformation material, possibly thixotropic, that readily undergoes (elastic) deformation in response to the application of a force (e.g., a material capable of deforming to fill small gaps, particularly with the application of force). For example, the compliant thermal interface material(s) used herein may have a hardness (Shore 00 or Shore 000) less than about 25 (e.g., a hardness in a range of about 5 to about 25), and a relatively low Young's modulus of elasticity. Accordingly, the hardness of the compliant thermal interface material(s) included in the thermal interface structure embodiments discussed herein is relatively low (e.g., 75 percent or lower), when compared with the hardness of the stiff thermal interface material(s) included in the thermal interface structure embodiment. Additionally, the Young's modulus of elasticity of the compliant thermal interface material(s) included in the thermal interface structure embodiments discussed herein is relatively low (e.g., 75 percent or lower), when compared with the Young's modulus of elasticity of the stiff thermal interface material(s) included in the thermal interface structure embodiment. According to various embodiments described below, the compliant thermal interface material has an XY-plane thermal conductivity in a range, from about 1 W/mK to about 250 W/mK, and a Z-axis thermal conductivity in a range from about 1 W/mK to about 250 W/mK. In some embodiments, the XY-plane and Z-axis thermal conductivities may be about 25 W/mK or less. According to various embodiments, the compliant thermal interface material(s) for the compliant TIM layer(s) (e.g., layers 520, FIGS. 5-11) may be selected from silicone-containing thermal gap filler (e.g., T-putty or S-putty, H-putty, and SH-putty), liquid solder, non-silicon resin material (e.g., thermal grease or thermal conductive grease), thermally conductive epoxy or epoxy paste (e.g., silver sinter epoxy paste), thermally conductive gel, or other suitable materials. In some embodiments, one or more of the compliant TIM layers may be reinforced with fiberglass (or other suitable reinforcement materials) on one or both sides.

Starting first with FIGS. 5A, 5B, 5C, 5D, 5E, and 5F, cross-sectional, side views of six embodiments of "uncontained" composite thermal interface structures 500, 540, 550, 560, 570, and 590 are illustrated. As used herein, an "uncontained" thermal interface structure includes a stack of a plurality of layers of multiple thermal interface materials (TIMs), which is not surrounded or contained by an external covering (as opposed to embodiments of "contained" thermal interface structures described later).

Figure 5B:
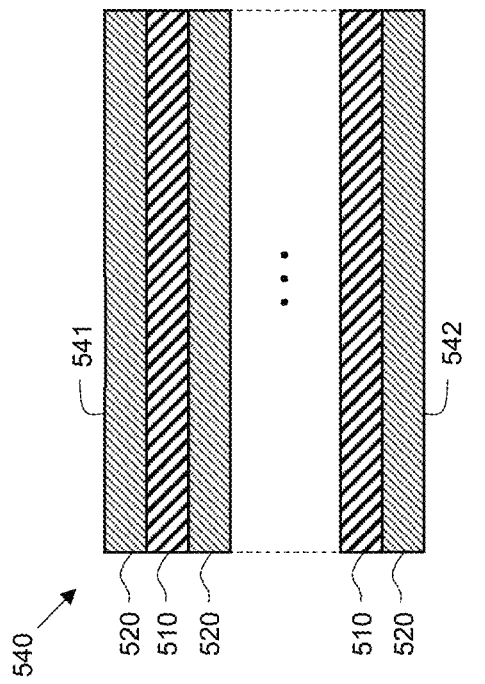
Figure 5D:
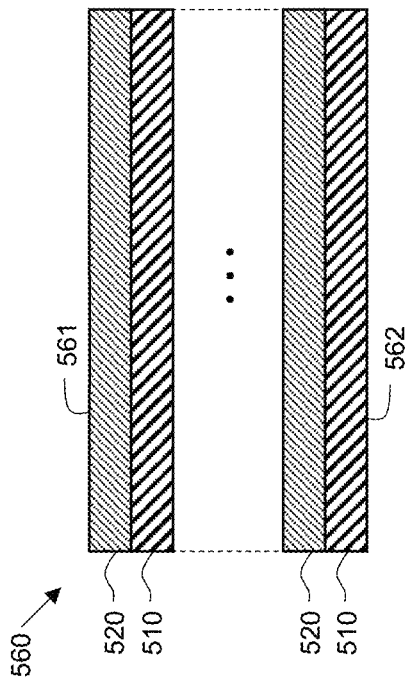
Figure 5A:
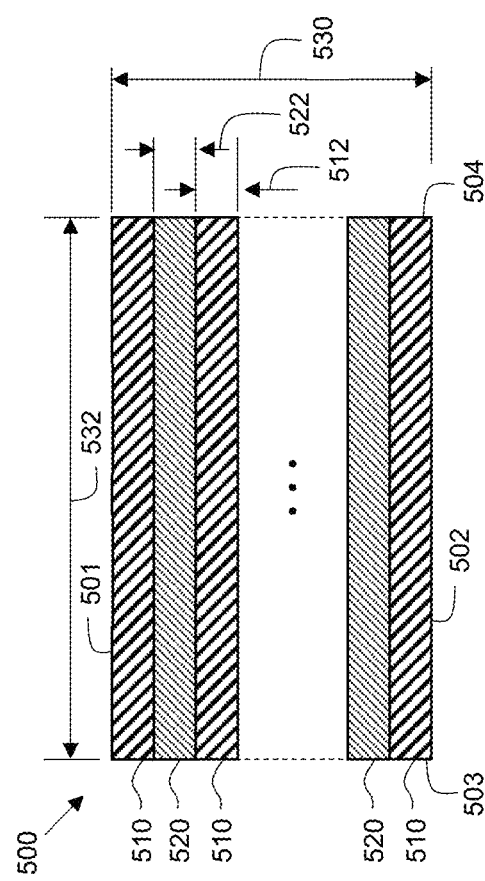

With reference first to FIG. 5A, a first embodiment of an uncontained thermal interface structure 500 is illustrated, which includes a stack of at least two stiff TIM layers 510 interleaved in an alternating arrangement with one or more compliant TIM layers 520. According to an embodiment, each layer 510, 520 in the stack is in direct contact with (or directly connected to) adjacent layers in the stack. In other words, for example, the lowest stiff TIM layer 510 is in direct contact with the lowest compliant TIM layer 520, the lowest compliant TIM layer 520 is in direct contact with the next highest stiff TIM layer 510, and so on.

In the embodiment of FIG. 5A, the top and bottom layers (or uppermost and lowest layers) of the structure 500 include stiff TIM layers 510. Accordingly, the top surface 501 of thermal interface structure 500 is defined by the exposed upper surface of a first stiff TIM layer 510, and the bottom surface 502 of thermal interface structure 500 is defined by the exposed lower surface of a second stiff TIM layer 510. At least one compliant TIM layer 520 is included between the first and second stiff TIM layers 510. In addition, zero or more additional stiff TIM layers 510 may be included between the first and second stiff TIM layers 510. Accordingly, an alternating arrangement of stiff and compliant TIM layers 510, 520 is exposed and visible along the sidewalls 503, 504 of the thermal interface structure 500, which extend between the top and bottom surfaces 501, 502. In the illustrated embodiment, thermal interface structure 500 includes three stiff TIM layers 510 and two compliant TIM layers 520. However, as indicated by the ellipses, thermal interface structure 500 may include fewer or more stiff TIM layers 510 (e.g., as few as two stiff TIM layers or up to 10 or more stiff TIM layers) and/or fewer or more compliant TIM layers 520 (e.g., as few as one compliant TIM layer or up to 10 or more compliant TIM layers). Either way, thermal interface structure 500 includes a number of stiff TIM layers 510 that is one greater than the number of compliant TIM layers 520, in an embodiment.

The stiff TIM layers 510 may be formed from one stiff TIM material or from multiple stiff TIM materials. For example, all of the stiff TIM layers 510 may be formed from the same stiff TIM material, or some of the stiff TIM layers 510 may be formed from different stiff TIM materials than the stiff TIM materials forming other stiff TIM layers 510. Further, each stiff TIM layer 510 may include a single layer of a single stiff TIM material. Alternatively, each stiff TIM layer 510 may include multiple layers of a single stiff TIM material stacked together, or may include multiple layers of different stiff TIM materials stacked together. Accordingly, the term "stiff TIM layer", as used herein, may mean a single layer of a stiff TIM material or multiple stiff TIM layers in direct contact with each other in a stack.

Similarly, the compliant TIM layers 520 may be formed from one compliant TIM material or from multiple compliant TIM materials. For example, all of the compliant TIM layers 520 may be formed from the same compliant TIM material, or some of the compliant TIM layers 520 may be formed from different compliant TIM materials than the compliant TIM materials forming other compliant TIM layers 520. Further, each compliant TIM layer 520 may include a single layer of a single compliant TIM material. Alternatively, each compliant TIM layer 520 may include multiple layers of a single compliant TIM material stacked together, or may include multiple layers of different compliant TIM materials stacked together. Accordingly, the term "compliant TIM layer", as used herein, may mean a single layer of a compliant TIM material or multiple compliant TIM layers in direct contact with each other in a stack.

The thickness 512 of each stiff TIM layer 510 may be in a range of about 5 microns to about 500 microns, although some or all of the stiff TIM layers 510 may be thinner or thicker, as well. The thickness 522 of each compliant TIM layer 520 may be in a range of about 5 microns to about 500 microns, although some or all of the compliant TIM layers 520 may be thinner or thicker, as well. According to an embodiment, an overall thickness 530 of thermal interface structure 500 may be in a range of about 10 microns to about 1000 microns, although thermal interface structure 500 may be thinner or thicker, as well. When incorporated into a larger electronic system (e.g., system 100, FIGS. 1, 2A, 2B), the top surface 501 of thermal interface structure 500 (e.g., top surface 132 of TIM 130, FIGS. 2A, 2B), which corresponds to the upper surface of the uppermost stiff TIM layer 510, may be brought into contact with a surface of a heat sink (e.g., surface 142 of heat sink 140, FIGS. 2A, 2B), and the bottom surface 502 of thermal interface structure 500 (e.g., bottom surface 131 of TIM 130, FIG. 2), which corresponds to the lower surface of the lowest stiff TIM layer 510, may be brought into contact with the thermal interface surface of an electronic component (e.g., surface 122 of component 120, 120', FIGS. 2A, 2B). A width 532 of thermal interface structure 500 generally should be approximately equal to the width of the electronic component that is contacted by the thermal interface structure 500 (e.g., in a range of about 1 millimeter (mm) to about 50 mm), although the width 532 may be narrower or wider than the electronic component, as well. Similarly, a depth of thermal interface structure 500 (i.e., the dimension into the page) generally should be approximately equal to the depth of the electronic component that is contacted by the thermal interface structure 500 (e.g., in a range of about 1 mm to about 50 mm), although the depth may be narrower or wider than the electronic component, as well.

With reference now to FIG. 5B, a second embodiment of an uncontained thermal interface structure 540 is illustrated, which includes a stack of at least two compliant TIM layers 520 interleaved in an alternating arrangement with one or more stiff TIM layers 510. According to an embodiment, each layer 510, 520 in the stack is in direct contact with (or directly connected to) adjacent layers in the stack. In other words, for example, the lowest compliant TIM layer 520 is in direct contact with the lowest stiff TIM layer 510, the lowest stiff TIM layer 510 is in direct contact with the next highest compliant TIM layer 520, and so on.

In the embodiment of FIG. 5B, the top and bottom layers (or uppermost and lowest layers) of the structure 540 include compliant TIM layers 520. Accordingly, the top surface 541 of thermal interface structure 540 is defined by the exposed upper surface of a first compliant TIM layer 520, and the bottom surface 542 of thermal interface structure 540 is defined by the exposed lower surface of a second compliant TIM layer 520. At least one stiff TIM layer 510 is included between the first and second compliant TIM layers 520. In addition, zero or more additional compliant TIM layers 520 may be included between the first and second compliant TIM layers 520. Again, an alternating arrangement of stiff and compliant TIM layers 510, 520 is exposed and visible along the sidewalls of the thermal interface structure 540. In the illustrated embodiment, thermal interface structure 540 includes three compliant TIM layers 520 and two stiff TIM layers 510. However, as indicated by the ellipses, thermal interface structure 540 may include fewer or more stiff TIM layers 510 (e.g., as few as one stiff TIM layer or up to 10 or more stiff TIM layers) and/or fewer or more compliant TIM layers 520 (e.g., as few as two compliant TIM layers or up to 10 or more compliant TIM layers). Either way, thermal interface structure 540 includes a number of compliant TIM layers 520 that is one greater than the number of stiff TIM layers 510, in an embodiment.

Again, in thermal interface structure 540, the stiff TIM layers 510 may be formed from one stiff TIM material or from multiple stiff TIM materials, and the compliant TIM layers 520 may be formed from one compliant TIM material or from multiple compliant TIM materials. The thicknesses/dimensions of the stiff and compliant TIM layers 510, 520, and the overall thickness and other dimensions (e.g., width and depth) of thermal interface structure 540 may be the same as described above for thermal interface structure 500 (FIG. 5A).

Figure 5C:
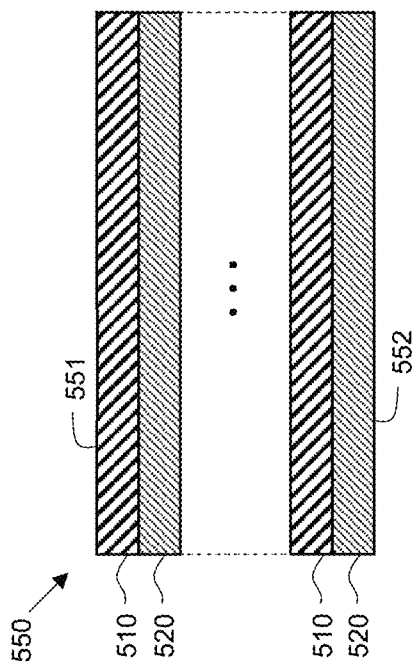

With reference now to FIG. 5C, a third embodiment of an uncontained thermal interface structure 550 is illustrated, which includes a stack of one or more compliant TIM layers 520 interleaved in an alternating arrangement with one or more stiff TIM layers 510. According to an embodiment, each layer 510, 520 in the stack is in direct contact with (or directly connected to) adjacent layers in the stack. In other words, for example, the lowest compliant TIM layer 520 is in direct contact with the lowest stiff TIM layer 510, the lowest stiff TIM layer 510 is in direct contact with the next highest compliant TIM layer 520, and so on.

In the embodiment of FIG. 5C, the bottom layer (or lowest layer) of the structure 550 includes a compliant TIM layer 520, and the top layer (or uppermost layer) of the structure 550 includes a stiff TIM layer 510. Accordingly, the top surface 551 of thermal interface structure 550 is defined by the exposed upper surface of a stiff TIM layer 510, and the bottom surface 552 of thermal interface structure 550 is defined by the exposed lower surface of a compliant TIM layer 520. Thermal interface structure 550 may include only two layers (i.e., one stiff TIM layer 510 and one compliant TIM layer 520), in an embodiment, or at least one additional stiff TIM layer 510 and at least one additional compliant TIM layer 520 may be included between the top and bottom TIM layers 510, 520. In the illustrated embodiment, thermal interface structure 550 includes two compliant TIM layers 520 and two stiff TIM layers 510. However, as indicated by the ellipses, thermal interface structure 550 may include fewer or more stiff TIM layers 510 (e.g., as few as one stiff TIM layer or up to 10 or more stiff TIM layers) and/or fewer or more compliant TIM layers 520 (e.g., as few as one compliant TIM layer or up to 10 or more compliant TIM layers). Either way, thermal interface structure 550 includes an equal number of stiff and compliant TIM layers 510, 520.

Again, in thermal interface structure 550, the stiff TIM layer(s) 510 may be formed from one stiff TIM material or from multiple stiff TIM materials, and the compliant TIM layer(s) 520 may be formed from one compliant TIM material or from multiple compliant TIM materials. The thicknesses/dimensions of the stiff and compliant TIM layers 510, 520, and the overall thickness and other dimensions (e.g., width and depth) of thermal interface structure 550 may be the same as described above for thermal interface structure 500 (FIG. 5A).

With reference now to FIG. 5D, a fourth embodiment of an uncontained thermal interface structure 560 is illustrated, which includes a stack of one or more compliant TIM layers 520 interleaved in an alternating arrangement with one or more stiff TIM layers 510. According to an embodiment, each layer 510, 520 in the stack is in direct contact with (or directly connected to) adjacent layers in the stack. In other words, for example, the lowest stiff TIM layer 510 is in direct contact with the lowest compliant TIM layer 520, the lowest compliant TIM layer 520 is in direct contact with the next highest stiff TIM layer 510, and so on.

In the embodiment of FIG. 5D, the bottom layer (or lowest layer) of the structure 560 includes a stiff TIM layer 510, and the top layer (or uppermost layer) of the structure 560 includes a compliant TIM layer 520. Accordingly, the top surface 561 of thermal interface structure 560 is defined by the exposed upper surface of a compliant TIM layer 520, and the bottom surface 562 of structure 560 is defined by the exposed lower surface of a stiff TIM layer 510. Thermal interface structure 560 may include only two layers (i.e., one stiff TIM layer 510 and one compliant TIM layer 520), in an embodiment, or at least one additional stiff TIM layer 510 and at least one additional compliant TIM layer 520 may be included between the top and bottom TIM layers 520, 510. In the illustrated embodiment, thermal interface structure 560 includes two compliant TIM layers 520 and two stiff TIM layers 510. However, as indicated by the ellipses, thermal interface structure 560 may include fewer or more stiff TIM layers 510 (e.g., as few as one stiff TIM layer or up to 10 or more stiff TIM layers) and/or fewer or more compliant TIM layers 520 (e.g., as few as one compliant TIM layer or up to 10 or more compliant TIM layers). Either way, thermal interface structure 560 includes an equal number of stiff and compliant TIM layers 510, 520.

Again, in thermal interface structure 560, the stiff TIM layer(s) 510 may be formed from one stiff TIM material or from multiple stiff TIM materials, and the compliant TIM layer(s) 520 may be formed from one compliant TIM material or from multiple compliant TIM materials. The thicknesses/dimensions of the stiff and compliant TIM layers 510, 520, and the overall thickness and other dimensions (e.g., width and depth) of thermal interface structure 550 may be the same as described above for thermal interface structure 500 (FIG. 5A).

With reference now to FIG. 5E, a fifth embodiment of an uncontained thermal interface structure 570 is illustrated, which includes a stack of one or more compliant TIM layers 520 interleaved in an alternating arrangement with one or more stiff TIM layers 510, along with one or more layers 580 of a shape memory alloy material ("shape memory alloy layer(s)"). As with previously-described embodiments, some of the stiff and compliant TIM layers 510, 520 in the stack may be in direct contact with (or directly connected to) adjacent layers in the stack. In addition, however, in the embodiment of FIG. 5E, a shape memory alloy layer 580 may be embedded within some or all of the compliant TIM layers 520, or positioned between adjacent sets of compliant and stiff TIM layers 520, 510.

According to an embodiment, each shape memory alloy layer 580 may be formed from copper-aluminum-nickel, nickel-titanium, an alloy (e.g., of zinc, copper, gold, and/or iron), or other suitable materials. The thickness 582 of each shape memory alloy layer 580 may be in a range from about 5 microns to about 500 microns, although each shape memory alloy layer 580 may be thinner or thicker, as well. In some embodiments, the shape memory alloy layer 580 may have a rectangular shape, with a width and depth that are equal to or smaller than (e.g., 10 to 50 percent smaller) the width and depth of the stiff and compliant TIM layers 510, 520. In other embodiments, each shape memory alloy layer 580 may have a circular, oval, or other shape.

Each shape memory alloy layer 580 has the characteristic of being deformable from a "pre-deformed shape" to a "deformed shape" when relatively cold, but returning from the deformed shape to its pre-deformed shape when heated. Essentially, the shape memory alloy layer(s) 580 can exist in either of two different phases (martensite or austenite), and the phase is dependent upon temperature and stress. At relatively low temperatures, martensite is thermodynamically favored, and at relatively high temperatures, austenite is thermodynamically favored. Accordingly, a shape memory alloy layer 580 may transition from austenite to martensite upon cooling, and may transition from martensite to austenite upon heating. Generally, these temperature-dependent transitions follow a hysteresis curve.

According to an embodiment, and as will be described in more detail below in conjunction with FIGS. 7A and 7B, the pre-deformed shape of each shape memory alloy layer 580 may be curved (e.g., concave or convex), and prior to assembly of the thermal interface structure 570, the shape memory alloy layer(s) 580 may be deformed to a relatively flat (planar) deformed shape. After assembly of the thermal interface structure 570, and as long as the shape memory alloy layer 580 is below the martensite-to-austenite transition temperature for the selected shape memory alloy material, the layer 580 retains its deformed shape. However, when the temperature of the layer 580 is raised above the martensite-to-austenite transition temperature (e.g., as a result of heat generated by electronic component 120, 120', FIG. 1), the layer 580 attempts to return to its pre-deformed shape (e.g., curved). Conversely, when the temperature of the layer 580 falls below an austenite-to-martensite transition temperature, the layer 580 may again be deformed (e.g., through the application of a clamping force to the thermal interface structure 570).

In the embodiment of FIG. 5E, both the bottom layer (or lowest layer) of the structure 570 and the top layer (of uppermost layer) of the structure 570 include a stiff TIM layer 510, and the shape memory alloy layer(s) 580 are positioned between the bottom and top, stiff TIM layers 510. Accordingly, the top surface 571 of thermal interface structure 570 is defined by the exposed upper surface of a first stiff TIM layer 510, and the bottom surface 572 of structure 570 is defined by the exposed lower surface of a second stiff TIM layer 510. At least one compliant TIM layer 520 is included between the first and second stiff TIM layers 510. In addition, zero or more additional stiff TIM layers 510 may be included between the first and second stiff TIM layers 510. Given the above-described and illustrated structure, even when the shape memory alloy layer(s) 580 are in their pre-deformed shape (e.g., curved), the shape memory alloy layer(s) 580 are constrained within the structure 570 by the bottom and top stiff TIM layers 510.

In the illustrated embodiment, thermal interface structure 570 includes two compliant TIM layers 520, two shape memory alloy layers 580, and three stiff TIM layers 510. However, as indicated by the ellipses, thermal interface structure 570 may include fewer or more stiff TIM layers 510 (e.g., as few as two stiff TIM layers or up to 10 or more stiff TIM layers) and/or fewer or more compliant TIM layers 520 (e.g., as few as one compliant TIM layer or up to 10 or more compliant TIM layers). Further, although thermal interface structure 570 is shown to include two shape memory alloy layers 580, in other embodiments, thermal interface structure 570 may include fewer or more shape memory alloy layers 580 (e.g., as few as one shape memory alloy layer 580 or up to 5 or more shape memory alloy layers 580).

Again, in thermal interface structure 570, the stiff TIM layers 510 may be formed from one stiff TIM material or from multiple stiff TIM materials, and the compliant TIM layers 520 may be formed from one compliant TIM material or from multiple compliant TIM materials. Additionally, the shape memory alloy layers 580 may be formed from one shape memory alloy material or from multiple shape memory alloy materials. The thicknesses/dimensions of the stiff and compliant TIM layers 510, 520, and the overall thickness and other dimensions (e.g., width and depth) of thermal interface structure 570 may be the same as described above for thermal interface structure 500 (FIG. 5A).

With reference now to FIG. 5F, a sixth embodiment of an uncontained thermal interface structure 590 is illustrated, which includes a stack of one or more stiff TIM layers 510 interleaved with one or more compliant TIM layers 520, along with one or more shape memory alloy layers 580. In the embodiment of FIG. 5F, the top and bottom layers (or uppermost and lowest layers) of the structure 590 include compliant TIM layers 520. Accordingly, the top surface 591 of thermal interface structure 590 is defined by the exposed upper surface of a first compliant TIM layer 520, and the bottom surface 592 of thermal interface structure 590 is defined by the exposed lower surface of a second compliant TIM layer 520. At least one stiff TIM layer 510 is included between the first and second compliant TIM layers 520. In addition, zero or more additional compliant TIM layers 520 may be included between the first and second compliant TIM layers 520. The shape memory alloy layer(s) 580 are positioned within or adjacent to the first and second compliant TIM layers 520.

In the illustrated embodiment, thermal interface structure 590 includes three compliant TIM layers 520, two shape memory alloy layers 580, and two stiff TIM layers 510. However, as indicated by the ellipses, thermal interface structure 590 may include fewer or more stiff TIM layers 510 (e.g., as few as one stiff TIM layers or up to 10 or more stiff TIM layers) and/or fewer or more compliant TIM layers 520 (e.g., as few as two compliant TIM layers or up to 10 or more compliant TIM layers). Further, although thermal interface structure 590 is shown to include two shape memory alloy layers 580, in other embodiments, thermal interface structure 590 may include fewer or more shape memory alloy layers 580 (e.g., as few as one shape memory alloy layer 580 or up to 5 or more shape memory alloy layers 580).

Again, in thermal interface structure 590, the stiff TIM layers 510 may be formed from one stiff TIM material or from multiple stiff TIM materials, and the compliant TIM layers 520 may be formed from one compliant TIM material or from multiple compliant TIM materials. Additionally, the shape memory alloy layers 580 may be formed from one shape memory alloy material or from multiple shape memory alloy materials. The thicknesses/dimensions of the stiff and compliant TIM layers 510, 520, and the thicknesses/dimensions of the shape memory alloy layer(s) 580, and the overall thickness and other dimensions (e.g., width and depth) of thermal interface structure 590 may be the same as described above for thermal interface structures 500, 570 (FIGS. 5A, 5E).

Figure 6A:
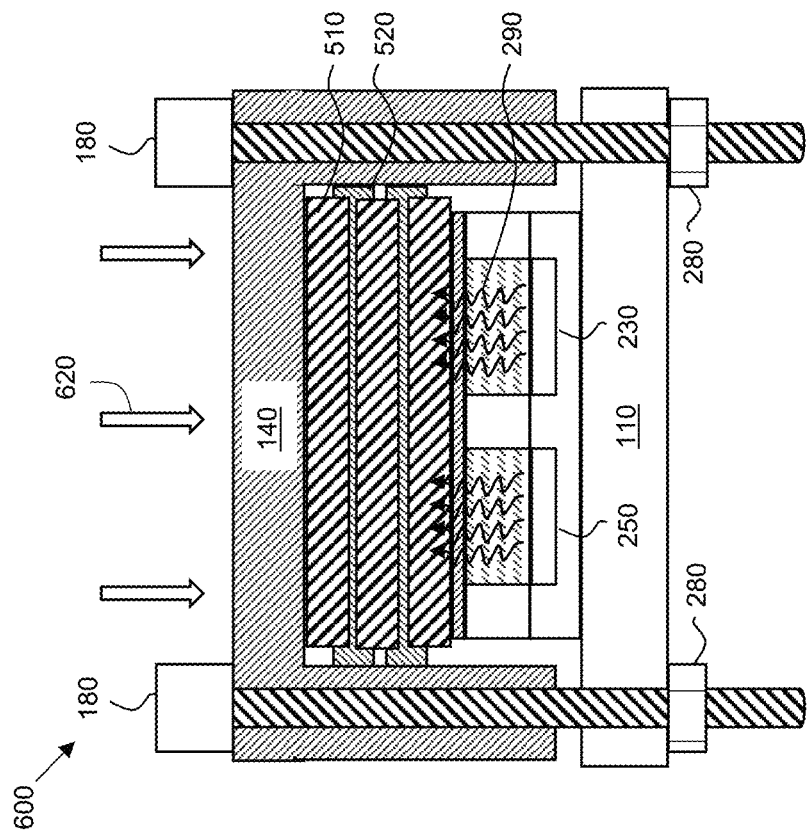
FIGS. 6A and 6B are cross-sectional, side views of an electrical system with a first embodiment of an uncontained composite thermal interface structure at stages before and after applying a clamping force to the system, in accordance with an embodiment.

Incorporation of the various embodiments of thermal interface structures described in conjunction with FIGS. 5A-5D into a larger electrical system will now be described in conjunction with FIGS. 6A and 6B, which illustrate cross-sectional, side views of an assembled electronic system 600. FIG. 6A depicts the assembled system 600 in a first or uncompressed state (i.e., before application of a clamping force), and FIG. 6B depicts the assembled system 600 in a second or compressed state (i.e., after application of a clamping force).

As with previously described system 100 (FIGS. 1, 2A, 2B), system 600 includes a system substrate 110, an electronic component 120, 120', an embodiment of a composite thermal interface structure 610, and a system heat sink 140, in accordance with an example embodiment. The system substrate 110, electronic component 120, 120', and system heat sink 140 may be similar or identical to the same-numbered features described in conjunction with FIGS. 1-4, and for purposes of brevity, the details of these features will not be repeated here. In various embodiments, the composite thermal interface structure 610 may have a structure corresponding to any of the embodiments of thermal interface structures described above in conjunction with FIGS. 5A-5D. In FIGS. 6A and 6B, thermal interface structure 610 most closely resembles an embodiment of thermal interface structure 500 described in conjunction with FIG. 5A, as structure 610 includes a plurality of stiff and compliant TIM layers 510, 520, with stiff TIM layers 510 defining the top and bottom surfaces of the structure 610. However, those of skill in the art would understand, based on the description herein, that thermal interface structure 610 alternatively may take the form of any one of the embodiments of thermal interface structures 540, 550, 560 described in conjunction with FIGS. 5B-5D.

To assemble system 600, and as shown in FIG. 6A, the electronic component 120, 120' is physically and electrically coupled to the system substrate 110, as described above. The bottom surface (e.g., surface 131, FIGS. 1, 2A, 2B or surfaces 502, 542, 552, 562, FIGS. 5A-5D) of thermal interface structure 610 is brought into contact with the thermal interface surface (e.g., surface 122, FIGS. 1, 2A, 2B) of the electronic component 120, 120', and heat sink 140 is brought into contact with the top surface (e.g., surface 132, FIGS. 1, 2A, 2B or surfaces 501, 541, 551, 561, FIGS. 5A-5D) of thermal interface structure 610. A securement mechanism (e.g., screws 180 and nuts 280, FIGS. 1, 2A, 2B) is then used to lightly secure the heat sink 140 to the system substrate 110.

Figure 6B:
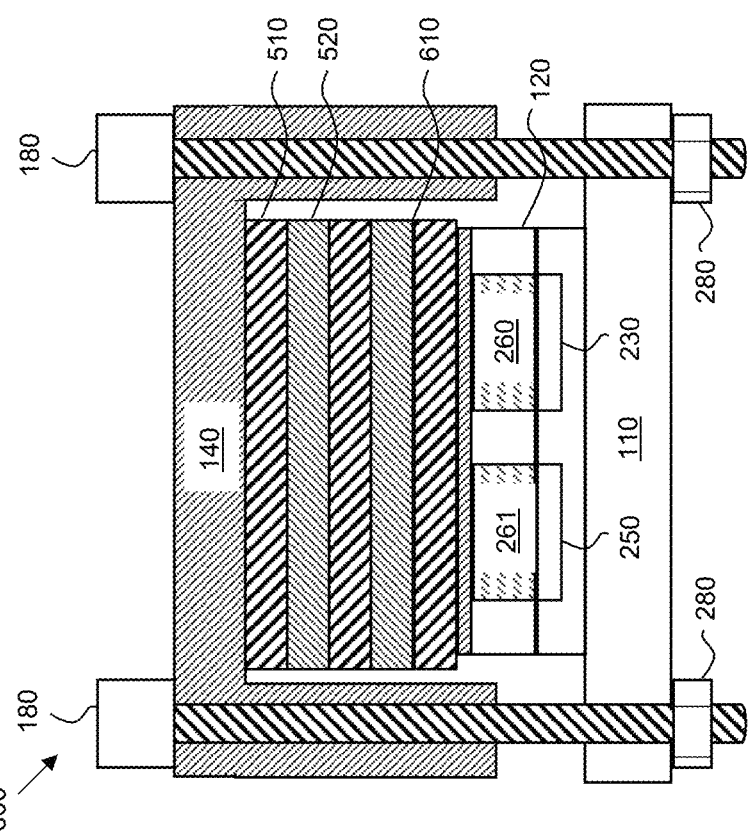

Referring to FIG. 6B, the securement mechanism is engaged (e.g., screws 180 and nuts 280 are tightened) to exert a clamping force (indicated by arrows 620) that brings the heat sink 140 and system substrate 110 closer together, while compressing the thermal interface structure 610 between the heat sink 140 and the electronic device 120, 120'. As indicated by the difference between the thermal interface structure 610 in FIGS. 6A and 6B, the clamping force 620 may cause the material of the compliant TIM layer(s) 520 to compress and, in some cases, to be partially squeezed out at the sidewalls of the thermal interface structure 610. Although screws 180 and nuts 280 are used as the securement mechanism in FIGS. 6A and 6B, those of skill in the art would understand, based on the description herein, that in other embodiments, other types of securement mechanisms (e.g., clips, clamps, or other mechanisms) alternatively may be used to exert the clamping force 620.

As discussed previously, the electronic device 120, 120' may include heat-producing semiconductor dies (e.g., dies 230, 250), and system operation may cause the semiconductor die(s) 230, 250 to produce excess heat, indicated by arrows 290 in FIG. 6B. This excess heat is drawn away from the semiconductor die(s) 230, 250 and the electronic component 120, 120' through a heat removal system that includes thermally-conductive structures 260, 261 of the electronic device 120, 120', thermal interface structure 610, and the system heat sink 140.

Incorporation of the various embodiments of thermal interface structures described in conjunction with FIGS. 5E and 5F into a larger electrical system will now be described in conjunction with FIGS. 7A and 7B, which are cross-sectional, side views of another embodiment of an assembled electronic system 630. FIG. 7A depicts the assembled system 630 in a first or already compressed state, but prior to system operation, and FIG. 7B depicts the assembled system 630 in a second, also compressed state, but during system operation.

As with previously described system 100 (FIGS. 1, 2A, 2B), system 630 includes a system substrate 110, an electronic component 120, 120', an embodiment of a composite thermal interface structure 640, and a system heat sink 140, in accordance with an example embodiment. The system substrate 110, electronic component 120, 120', and system heat sink 140 may be similar or identical to the same-numbered features described in conjunction with FIGS. 1-4, and for purposes of brevity, the details of these features will not be repeated here. In various embodiments, the composite thermal interface structure 640 may have a structure corresponding to any of the embodiments of thermal interface structures described above in conjunction with FIGS. 5E and 5F. In FIGS. 7A and 7B, thermal interface structure 640 most closely resembles an embodiment of thermal interface structure 570 described in conjunction with FIG. 5E, as structure 640 includes a plurality of stiff and compliant TIM layers 510, 520, and two shape memory alloy layers 580, with stiff TIM layers 510 defining the top and bottom surfaces of the structure 640. However, those of skill in the art would understand, based on the description herein, that thermal interface structure 640 alternatively may resemble the embodiment of thermal interface structure 590 described in conjunction with FIG. 5F, or other embodiments of thermal interface structures 570, 590 described above.

Figure 7A:
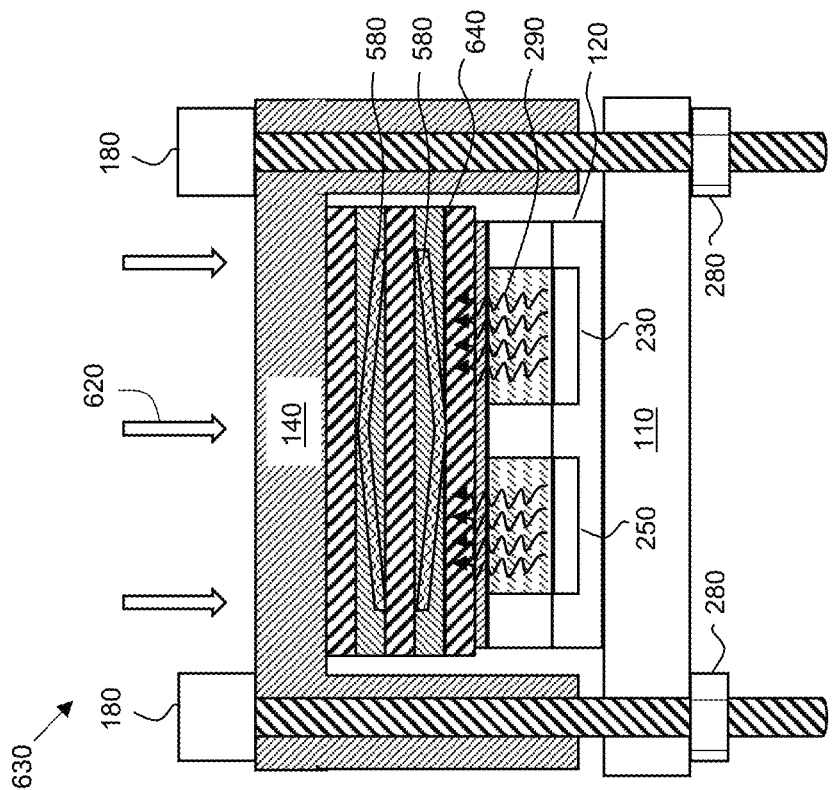
FIGS. 7A and 7B are cross-sectional, side views of an electrical system with a second embodiment of an uncontained composite thermal interface structure at stages before and after system operation and its associated heat generation, in accordance with an embodiment.
Figure 7B:
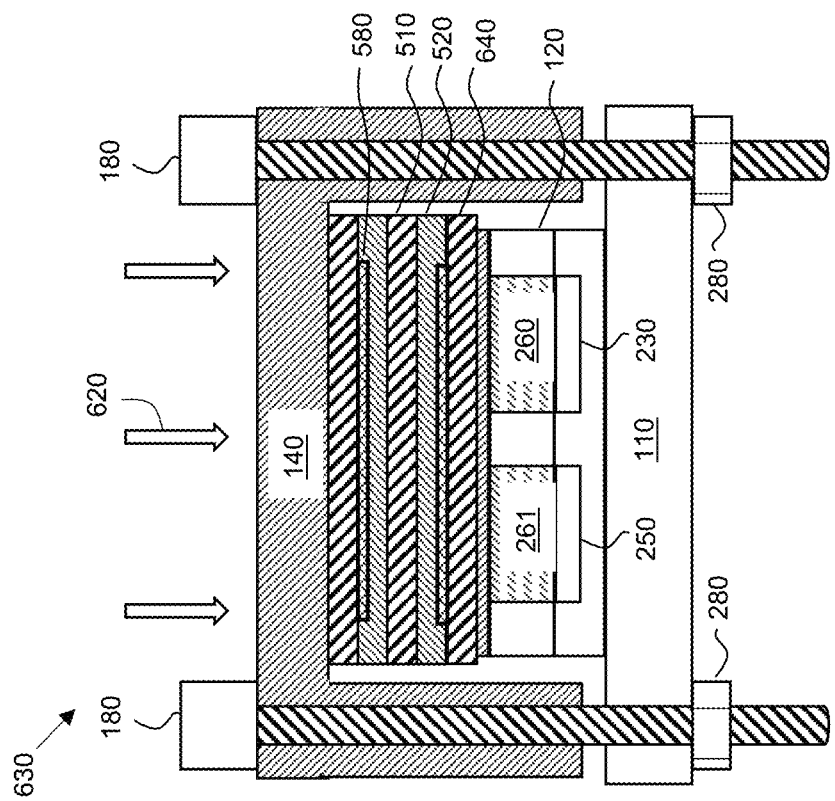

To assemble system 630, and as shown in FIG. 7A, the electronic component 120, 120' is physically and electrically coupled to the system substrate 110, as described above. The bottom surface (e.g., surface 131, FIGS. 1, 2A, 2B or surfaces 572, 592, FIGS. 5E, 5F) of thermal interface structure 640 is brought into contact with the thermal interface surface (e.g., surface 122, FIGS. 1, 2A, 2B) of the electronic component 120, 120', and heat sink 140 is brought into contact with the top surface (e.g., surface 132, FIGS. 1, 2A, 2B or surfaces 571, 591, FIGS. 5E, 5F) of thermal interface structure 640. A securement mechanism (e.g., screws 180 and nuts 280, FIGS. 1, 2A, 2B) is then used to lightly secure the heat sink 140 to the system substrate 110.

As shown in FIG. 7A, the securement mechanism is engaged (e.g., screws 180 and nuts 280 are tightened) to exert a clamping force (indicated by arrows 620) that brings the heat sink 140 and system substrate 110 closer together, while compressing the thermal interface structure 640 between the heat sink 140 and the electronic device 120, 120'. Again, although screws 180 and nuts 280 are used as the securement mechanism in FIGS. 7A and 7B, those of skill in the art would understand, based on the description herein, that in other embodiments, other types of securement mechanisms (e.g., clips, clamps, or other mechanisms) alternatively may be used to exert the clamping force 620.

As discussed above, the shape memory alloy layer(s) 580 may be deformed from a pre-deformed shape into a deformed shape prior to assembly of the thermal interface structure 640, and the shape memory alloy layer(s) 580 may retain the deformed shape when the system 630 is at a relatively low temperature. However, as discussed previously, the electronic device 120, 120' may include heat-producing semiconductor dies (e.g., dies 230, 250), and system operation may cause the semiconductor die(s) 230, 250 to produce excess heat, indicated by arrows 290 in FIG. 7B. This excess heat is drawn away from the semiconductor die(s) 230, 250 and the electronic component 120, 120' through a heat removal system that includes thermally-conductive structures 260, 261 of the electronic device 120, 120', thermal interface structure 640, and the system heat sink 140.

When the heat produced by the semiconductor dies 230, 250 is sufficient to cause a martensite-to-austenite phase transition, the shape memory alloy layer(s) 580 strive to return to their pre-deformed shape. Because each of the shape memory alloy layer(s) 580 are positioned within or adjacent to a compliant TIM layer 520, the shape memory alloy layer(s) 580 may readily deflect within the compliant TIM layer(s) 520. For example, as illustrated in FIG. 7B, the pre-deformed shape of each shape memory alloy layer 580 may be a curved shape. In the illustrated embodiment, the upper shape memory alloy layer 580 is configured to return to a pre-deformed, curved shape (in the presence of sufficient heat) that exerts a first, upward force roughly to the center of the stiff TIM layer 510 that defines the top surface of the thermal interface structure 640, while exerting a second, downward force roughly to the perimeter of the interior stiff TIM layer 510 underlying the upper shape memory alloy layer 580. Conversely, the lower shape memory alloy layer 580 is configured to return to a pre-deformed, curved shape (in the presence of sufficient heat) that exerts a third, downward force roughly to the center of the stiff TIM layer 510 that defines the bottom surface of the thermal interface structure 640, while exerting a fourth, upward force roughly to the perimeter of the interior stiff TIM layer 510 overlying the lower shape memory alloy layer 580. In other words, the two shape memory alloy layers 580 are oriented within the thermal interface structure 640 so that one of the layers 580 returns to a concave pre-deformed shape, and the other one of the layers 580 returns to a convex pre-deformed shape, thus exerting maximal outward force between roughly the centers of the upper and lower stiff TIM layers 510. In an alternate embodiment, each of the upper and lower shape memory alloy layers 580 may be flipped so that each returns to a pre-deformed shape that compresses against the perimeters of the top and bottom stiff TIM layers 510, while also compressing against the center of a central stiff TIM layer 510. In still other embodiments, a single shape memory alloy layer 580 may be included in the thermal interface structure 640, more than two shape memory alloy layers 580 may be included in the structure 640, the shape memory alloy layer(s) may be deformed prior to assembly to a deformed shape other than a planar shape, and/or the pre-deformed shape of the shape memory alloy layer(s) may be a shape other than a curved shape.

FIGS. 5A-5F, described above, depict six embodiments of "uncontained" composite thermal interface structures 500, 540, 550, 560, 570, and 590. In other embodiments, "contained" composite thermal interface structures instead may be used in a system as heat transfer devices in place of the above-described "uncontained" composite thermal interface structures. As used herein, a "contained" thermal interface structure includes a stack of a plurality of layers of multiple thermal interface materials, which is fully or partially surrounded or contained by an external covering (e.g., a collapsible encasement 810, 821, FIGS. 8A-8D).

FIGS. 8A, 8B, 8C, and 8D depict four embodiments of "contained" composite thermal interface structures 800, 820, 830, 840. With reference first to FIG. 8A, a first embodiment of a contained thermal interface structure 800 is illustrated. Thermal interface structure 800 essentially includes an uncontained composite thermal interface structure (e.g., any one of structures 500, 540, 550, 560, FIGS. 5A-5D) comprising a stack of multiple thermal interface materials, described in detail above, and a collapsible encasement 810 at least partially surrounding the stack. According to various embodiments, the thermal interface material stack includes at least two stiff TIM layers 510 interleaved in an alternating arrangement with one or more compliant TIM layers 520. In the embodiment illustrated in FIG. 8A, the stack of thermal interface materials may be essentially identical to the uncontained composite thermal interface structure 500 (FIG. 5A) and/or to the various embodiments of composite thermal interface structure 500 described above. In other embodiments, the stack of thermal interface materials enclosed by collapsible encasement 810 may be essentially identical to the uncontained composite thermal interface structures 540, 550, 560, FIGS. 5B-5D and/or to the various embodiments of composite thermal interface structure 500 described above. For brevity, the details and alternatives associated with thermal interface structures 500, 540, 550, 560 are not repeated here, but they are intended to apply equally to the thermal interface structure 800 of FIG. 8A.

Figure 9B:
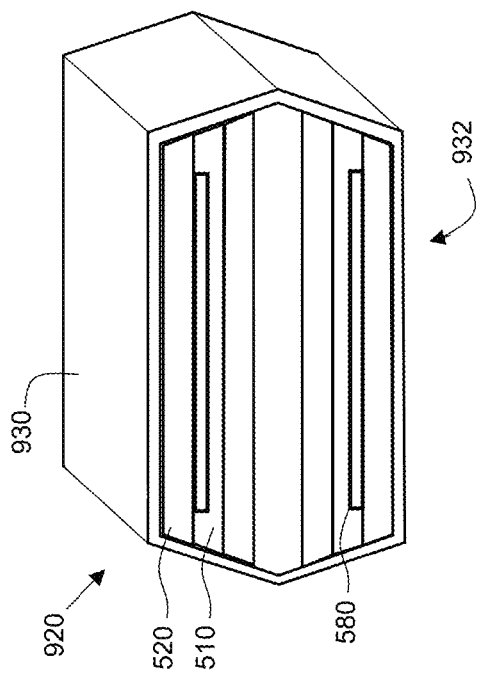
FIGS. 9A and 9B are perspective exterior views of two embodiments of "contained" composite thermal interface structures.
Figure 9A:
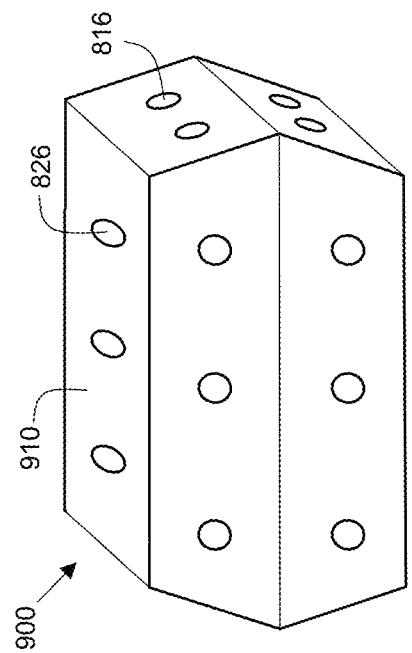

Collapsible encasement 810 either fully or partially surrounds the stack of stiff and compliant TIM layers 510, 520. For example, referring briefly to FIG. 9A, a collapsible encasement 910 is shown, which fully surrounds and encloses a stack of multiple TIM layers (e.g., layers 510, 520), where "fully surrounds," in this context, means that interior surfaces of the collapsible encasement 910 contact the top, bottom, and all sidewalls of the stack. Alternatively, referring briefly to FIG. 9B, a collapsible encasement 930 is shown, which only partially surrounds and encloses a stack of multiple TIM layers (e.g., layers 510, 520). In this context, "partially surrounds" means that interior surfaces of the collapsible encasement 930 contact the top, bottom, and at least one but fewer than all sidewalls of the stack. Whether the collapsible encasement 810 fully or partially surrounds the stack, the outermost, top and bottom TIM layers (e.g., stiff TIM layers 510 and/or compliant TIM layers 520) may be contacted by interior top and bottom surfaces, respectively, of the collapsible encasement 810. When the collapsible encasement 810 fully surrounds the stack, all four sidewalls of the stack (e.g., sidewalls 503, 504, FIG. 5A) may be contacted by four interior sidewalls of the collapsible encasement 810, as illustrated in FIG. 9A for collapsible encasement 910. Alternatively, when the collapsible encasement 810 only partially surrounds the stack, then only some (but not all) sidewalls of the stack may be contacted by one or more sidewalls of the collapsible encasement 810, as illustrated in FIG. 9B for collapsible encasement 930. For example, as illustrated in FIG. 9B, the collapsible encasement 930 may include only one, two, or three sidewalls, and at least one sidewall of the TIM stack may be exposed through a side opening of the collapsible encasement 930.

Collapsible encasement 810 has a top surface 811 defined by a top section of collapsible material, a bottom surface 812 defined by a bottom section of collapsible material, and sidewall sections 813 defined by side sections of collapsible material. Desirably, the material used for collapsible encasement 810 has relatively high thermal conductivity, and is able to be deformed or crushed without tearing. For example, collapsible encasement 810 may be formed from one or more collapsible materials and/or collapsible material layers, including but not limited to one or more collapsible metals, metal foil layers (e.g., foil(s) of copper, aluminum, indium, silver, or alloys thereof), a shape memory alloy layer, and/or one or more other suitable materials. According to an embodiment, collapsible encasement 810 has a thickness 814 in a range of about 0.005 mm to about 0.2 mm, although collapsible encasement 810 may be thinner or thicker, as well.

In some embodiments, collapsible encasement 810 may include one or more side through holes or openings 816, which provide for fluid engagement between the interior and exterior of the collapsible encasement 810 (i.e., each opening 816 provides a channel through which air and/or compliant thermal interface material may flow). For example, the openings 816 may align with one or more compliant TIM layers 520, so that, during compression of the contained composite thermal interface structure 800 (e.g., due to an applied clamping force between the top and bottom surfaces 811, 812 of the collapsible encasement 810), air and/or compliant TIM from the compliant TIM layer(s) 520 may flow through the openings 816 to enable the air and/or compliant TIM to escape the interior of the collapsible encasement 810, potentially preventing voids within the stack and/or unintended rupture of the collapsible encasement 810.

Referring now to FIG. 8B, another embodiment of a composite thermal interface structure 820 includes an uncontained composite thermal interface structure (e.g., any one of structures 500, 540, 550, 560, FIGS. 5A-5D) comprising a stack of multiple thermal interface materials, described in detail above, where at least some of the stiff TIM layers 510 include holes or openings 828 between their top and bottom surfaces, which provide for fluid engagement between the top and bottom surfaces of the stiff TIM layers 510. In addition, the composite thermal interface structure 820 includes a collapsible encasement 821 at least partially surrounding the stack. The collapsible encasement 821 may be substantially similar to collapsible encasement 810 (FIG. 8A), and the details discussed above with respect to collapsible encasement 810 apply also to collapsible encasement 821. For example, collapsible encasement 821 also may include side holes or openings 816 that are aligned with compliant TIM layer(s) 520. However, in the embodiment of FIG. 8B, collapsible encasement 821 also or alternatively may include top and/or bottom through holes or openings 826, which provide for fluid engagement between the interior and exterior of the collapsible encasement 821. Accordingly, during compression of the contained composite thermal interface structure 820 (e.g., due to an applied clamping force between the top and bottom surfaces 822, 823 of the collapsible encasement 820), air and/or compliant TIM from the compliant TIM layer(s) 520 may flow through the openings 816, 826 to enable the air and/or compliant TIM to escape the interior of the collapsible encasement 820, potentially preventing voids within the stack and/or unintended rupture of the collapsible encasement 820.

Referring now to FIGS. 8C and 8D, additional embodiments of composite thermal interface structures 830, 840 each include an uncontained composite thermal interface structure (e.g., any one of structures 570, 590, FIGS. 5E, 5F) comprising a stack of multiple stiff and compliant TIM layers 510, 520 and one or more shape memory alloy layers 580, as described in detail above. In addition, each of composite thermal interface structures 830, 840 each include a collapsible encasement 810 at least partially surrounding the stack.

According to various embodiments, the thermal interface material stack includes at least two stiff TIM layers 510 interleaved in an alternating arrangement with one or more compliant TIM layers 520, and one or more shape memory alloy layers 580 within or adjacent to the compliant TIM layer(s) 520. In the embodiment illustrated in FIG. 8C, the stack of thermal interface materials may be essentially identical to the uncontained composite thermal interface structure 500 (FIG. 5E) and/or to the various embodiments of composite thermal interface structure 570 described above. Conversely, in the embodiment illustrated in FIG. 8D, the stack of thermal interface materials may be essentially identical to the uncontained composite thermal interface structure 590 (FIG. 5F) and/or to the various embodiments of composite thermal interface structure 590 described above. For brevity, the details and alternatives associated with thermal interface structures 570, 590 are not repeated here, but they are intended to apply equally to the thermal interface structures 830, 840 of FIGS. 8C and 8D. Further, the details and alternatives associated with collapsible encasement 810 discussed above also are intended to apply equally to the collapsible encasement 810 of thermal interface structures 830, 840. For example, in some embodiments, the collapsible encasement 810 of thermal interface structures 830, 840 may include side through holes or openings 816. Further, although not shown in FIGS. 8C and 8D, the collapsible encasement 810 of thermal interface structures 830, 840 also or alternatively may include top and/or bottom holes or openings (e.g., openings 826, FIG. 8B).

As mentioned above, in alternate embodiments, a collapsible encasement 810, 821 (FIGS. 8A-8D) may either fully or partially surround a thermal interface structure (i.e., a stack of stiff and compliant TIM layers 510, 520 and, in some embodiments, shape memory alloy layer(s) 580) contained therein. Referring now to FIGS. 9A and 9B, for example, perspective exterior views of two embodiments of contained composite thermal interface structures 900, 920 are shown.

In the embodiment of FIG. 9A, a collapsible encasement 910 (e.g., collapsible encasement 810 or 821) fully surrounds a thermal interface structure (e.g., any of structures 500, 540, 550, 560, 570, 580, FIGS. 5A-5F) contained within the collapsible encasement 910. Accordingly, the top, bottom, and all side surfaces of the interior thermal interface structure are contacted by top, bottom, and side portions of the collapsible encasement 910. In the illustrated embodiment, the collapsible encasement 910 also includes through holes or openings 816, 826 in the side and top portions of the collapsible encasement 910. In other embodiments, some or all of the openings 816, 826 may be excluded.

In the embodiment of FIG. 9B, a collapsible encasement 930 (e.g., collapsible encasement 810 or 821) only partially surrounds a thermal interface structure (e.g., any of structures 500, 540, 550, 560, 570, 580, FIGS. 5A-5F) contained within the collapsible encasement 930. More specifically, in the illustrated embodiment, the top, bottom, and two opposite side surfaces of the interior thermal interface structure are contacted by top, bottom, and two side portions of the collapsible encasement 910, and side openings 932 in the collapsible encasement 930 expose the other two opposite side surfaces (or sidewalls) of the interior thermal interface structure. Although not shown in the illustrated embodiment, the collapsible encasement 930 also may include through holes or openings (e.g., openings 816 and/or 826) in the side and top portions of the collapsible encasement 930.

Incorporation of the various embodiments of thermal interface structures described in conjunction with FIGS. 8A and 8B into a larger electrical system will now be described in conjunction with FIGS. 10A and 10B, which illustrate cross-sectional, side views of an assembled electronic system 1000. FIG. 10A depicts the assembled system 1000 in a first or uncompressed state (i.e., before application of a clamping force), and FIG. 10B depicts the assembled system 1000 in a second or compressed state (i.e., after application of a clamping force).

As with previously described system 100 (FIGS. 1, 2A, 2B), system 1000 includes a system substrate 110, an electronic component 120, 120', an embodiment of a composite thermal interface structure 1010, and a system heat sink 140, in accordance with an example embodiment. The system substrate 110, electronic component 120, 120', and system heat sink 140 may be similar or identical to the same-numbered features described in conjunction with FIGS. 1-4, and for purposes of brevity, the details of these features will not be repeated here. In various embodiments, the composite thermal interface structure 1010 may have a structure corresponding to any of the embodiments of thermal interface structures described above in conjunction with FIGS. 8A and 8B. In FIGS. 10A and 10B, thermal interface structure 1010 most closely resembles an embodiment of thermal interface structure 800 described in conjunction with FIG. 8A, as structure 1010 includes a stack that comprises a plurality of stiff and compliant TIM layers 510, 520, with stiff TIM layers 510 defining the top and bottom surfaces of the stack, along with a collapsible encasement 810 at least partially surrounding the stack. However, those of skill in the art would understand, based on the description herein, that thermal interface structure 1010 alternatively may take the form of the embodiment of thermal interface structure 820 described in conjunction with FIG. 8B.

To assemble system 1000, and as shown in FIG. 10A, the electronic component 120, 120' is physically and electrically coupled to the system substrate 110, as described above. The bottom surface (e.g., surface 131, FIGS. 1, 2A, 2B or surfaces 812, 823, FIGS. 8A, 8B) of thermal interface structure 1010 is brought into contact with the thermal interface surface (e.g., surface 122, FIGS. 1, 2A, 2B) of the electronic component 120, 120', and heat sink 140 is brought into contact with the top surface (e.g., surface 132, FIGS. 1, 2A, 2B or surfaces 810, 822, FIGS. 8A, 8B) of thermal interface structure 1010. A securement mechanism (e.g., screws 180 and nuts 280, FIGS. 1, 2A, 2B) is then used to lightly secure the heat sink 140 to the system substrate 110.

Referring to FIG. 10B, the securement mechanism is engaged (e.g., screws 180 and nuts 280 are tightened) to exert a clamping force (indicated by arrows 1020) that brings the heat sink 140 and system substrate 110 closer together, while compressing the thermal interface structure 1010 between the heat sink 140 and the electronic device 120, 120'. As indicated by the difference between the thermal interface structure 1010 in FIGS. 10A and 10B, the clamping force 1020 may cause the collapsible encasement 810 to be squeezed and distorted (e.g., to have its top and bottom surfaces brought closer together while the side surfaces bow outward), and accordingly may cause the material of the compliant TIM layer(s) 520 to compress and, in some cases, to be partially squeezed out through openings (e.g., openings 816, 826, FIGS. 8A, 8B, 9A) in the collapsible encasement 810 and/or to be squeezed out at open sides (e.g., side openings 932, FIG. 9B) of the collapsible encasement 810. Although screws 180 and nuts 280 are used as the securement mechanism in FIGS. 10A and 10B, those of skill in the art would understand, based on the description herein, that in other embodiments, other types of securement mechanisms (e.g., clips, clamps, or other mechanisms) alternatively may be used to exert the clamping force 1020.

As discussed previously, the electronic device 120, 120' may include heat-producing semiconductor dies (e.g., dies 230, 250), and system operation may cause the semiconductor die(s) 230, 250 to produce excess heat, indicated by arrows 1090 in FIG. 10B. This excess heat is drawn away from the semiconductor die(s) 230, 250 and the electronic component 120, 120' through a heat removal system that includes thermally-conductive structures 260, 261 of the electronic device 120, 120', thermal interface structure 1010, and the system heat sink 140.

Figure 11A:
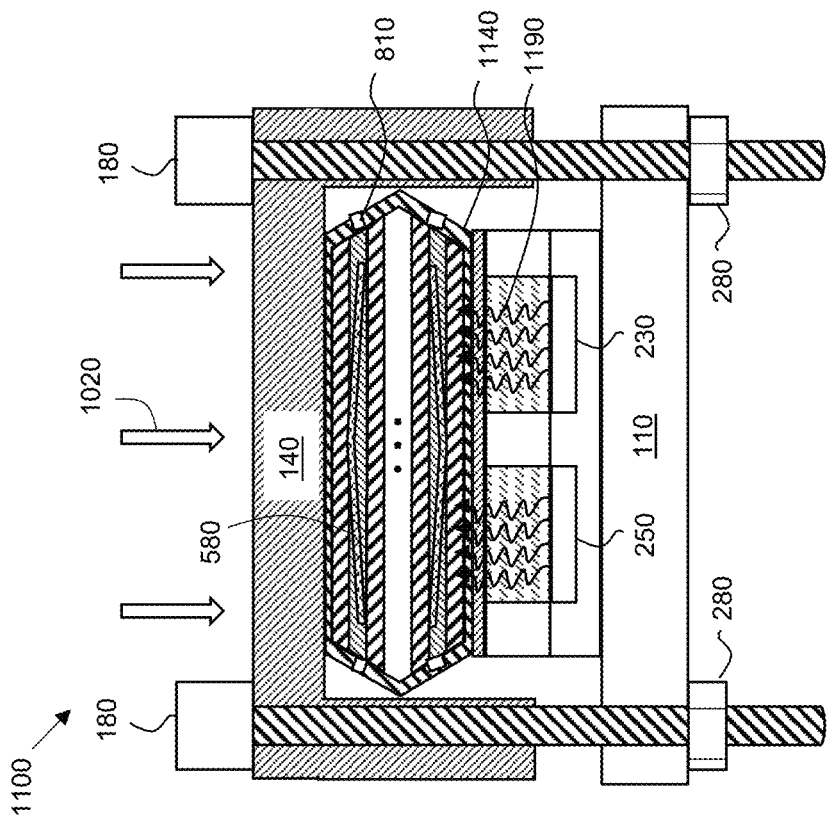
FIGS. 11A and 11B are cross-sectional, side views of an electrical system with a second embodiment of a contained composite thermal interface structure at stages before and after system operation and its associated heat generation, in accordance with an embodiment.
Figure 11B:
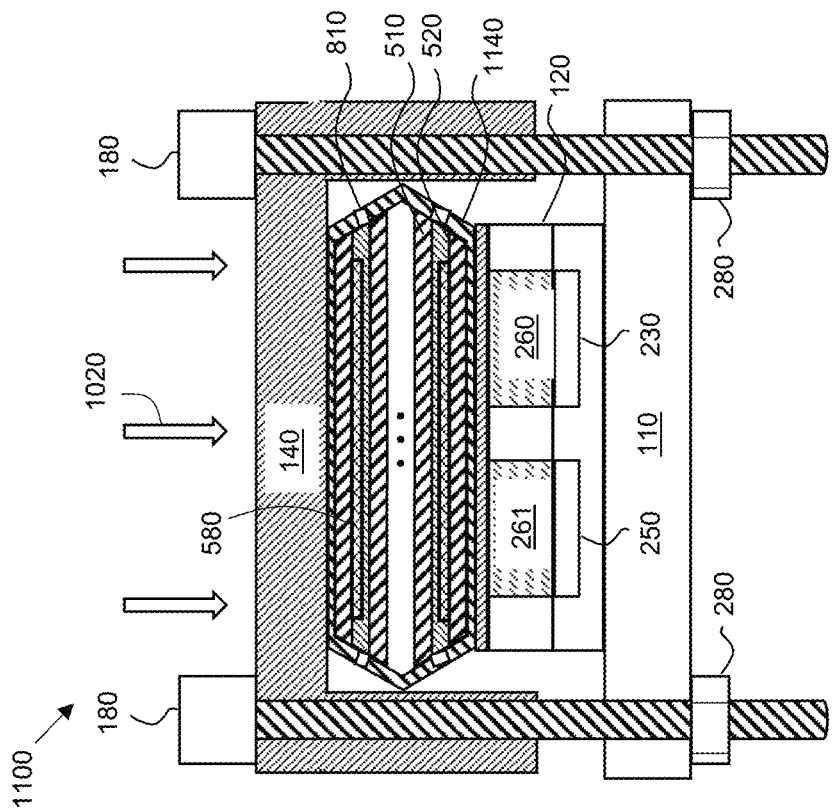
Figure 12:
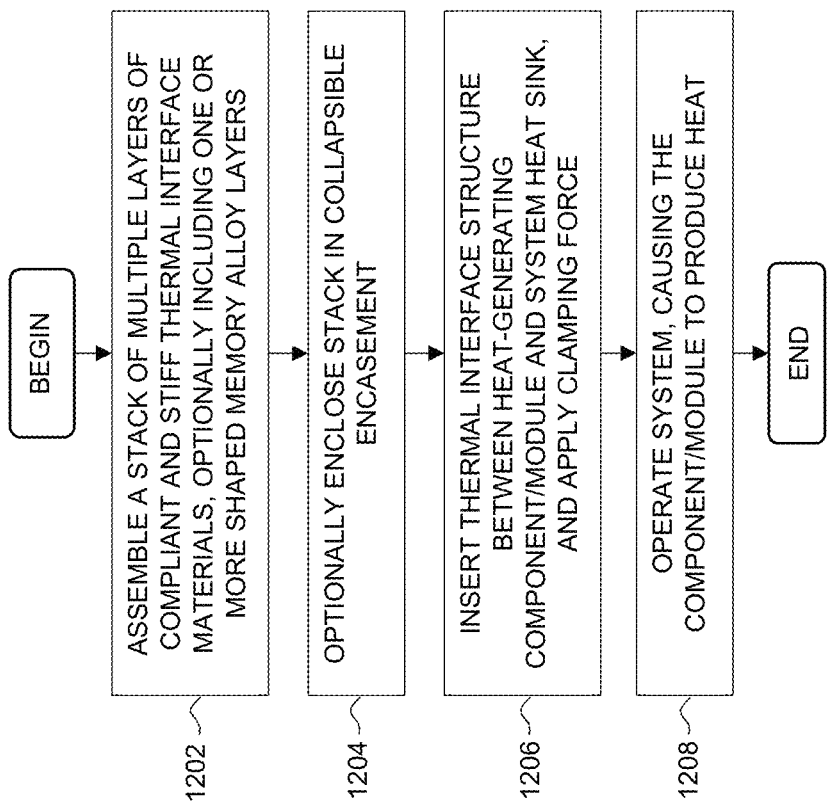
FIG. 12 is a flowchart for fabricating a composite thermal interface structure and incorporating the composite thermal interface structure in an electrical system, in accordance with an example embodiment.

Incorporation of the various embodiments of thermal interface structures described in conjunction with FIGS. 8C and 8D into a larger electrical system will now be described in conjunction with FIGS. 11A and 11B, which are cross-sectional, side views of another embodiment of an assembled electronic system 1100. FIG. 11A depicts the assembled system 1100 in a first or already compressed state, but prior to system operation, and FIG. 11B depicts the assembled system 1100 in a second, also compressed state, but during system operation.

As with previously described system 100 (FIGS. 1, 2A, 2B), system 1100 includes a system substrate 110, an electronic component 120, 120', an embodiment of a composite thermal interface structure 1140, and a system heat sink 140, in accordance with an example embodiment. The system substrate 110, electronic component 120, 120', and system heat sink 140 may be similar or identical to the same-numbered features described in conjunction with FIGS. 1-4, and for purposes of brevity, the details of these features will not be repeated here. In various embodiments, the composite thermal interface structure 1140 may have a structure corresponding to any of the embodiments of thermal interface structures described above in conjunction with FIGS. 8C and 8D. In FIGS. 11A and 11B, thermal interface structure 1140 most closely resembles an embodiment of thermal interface structure 830 described in conjunction with FIG. 8C, as structure 1140 includes a stack comprised of a plurality of stiff and compliant TIM layers 510, 520, and two shape memory alloy layers 580, with stiff TIM layers 510 defining the top and bottom surfaces of the stack, along with a collapsible encasement 810. However, those of skill in the art would understand, based on the description herein, that thermal interface structure 1140 alternatively may resemble the embodiment of thermal interface structure 840 described in conjunction with FIG. 8D, or other embodiments of thermal interface structures described above.

To assemble system 1100, and as shown in FIG. 11A, the electronic component 120, 120' is physically and electrically coupled to the system substrate 110, as described above. The bottom surface (e.g., surface 131, FIGS. 1, 2A, 2B or surface 812, FIGS. 8C, 8D) of thermal interface structure 1140 is brought into contact with the thermal interface surface (e.g., surface 122, FIGS. 1, 2A, 2B) of the electronic component 120, 120', and heat sink 140 is brought into contact with the top surface (e.g., surface 132, FIGS. 1, 2A, 2B or surface 811, FIGS. 8C, 8D) of thermal interface structure 1140. A securement mechanism (e.g., screws 180 and nuts 280, FIGS. 1, 2A, 2B) is then used to lightly secure the heat sink 140 to the system substrate 110.

As shown in FIG. 11A, the securement mechanism is engaged (e.g., screws 180 and nuts 280 are tightened) to exert a clamping force (indicated by arrows 1020) that brings the heat sink 140 and system substrate 110 closer together, while compressing the thermal interface structure 1140 between the heat sink 140 and the electronic device 120, 120'. The clamping force 1020 may cause the collapsible encasement 810 to be squeezed and distorted (e.g., to have its top and bottom surfaces brought closer together while the side surfaces bow outward), and accordingly may cause the material of the compliant TIM layer(s) 520 to compress and, in some cases, to be partially squeezed out through openings (e.g., openings 816, 826, FIGS. 8C, 8D, 9A) in the collapsible encasement 810 and/or to be squeezed out at open sides (e.g., side openings 932, FIG. 9B) of the collapsible encasement 810. Again, although screws 180 and nuts 280 are used as the securement mechanism in FIGS. 11A and 11B, those of skill in the art would understand, based on the description herein, that in other embodiments, other types of securement mechanisms (e.g., clips, clamps, or other mechanisms) alternatively may be used to exert the clamping force 1020.

As discussed above, the shape memory alloy layer(s) 580 may be deformed from a pre-deformed shape into a deformed shape prior to assembly of the thermal interface structure 1140, and the shape memory alloy layer(s) 580 may retain the deformed shape when the system 1130 is at a relatively low temperature. However, as discussed previously, the electronic device 120, 120' may include heat-producing semiconductor dies (e.g., dies 230, 250), and system operation may cause the semiconductor die(s) 230, 250 to produce excess heat, indicated by arrows 1190 in FIG. 11B. This excess heat is drawn away from the semiconductor die(s) 230, 250 and the electronic component 120, 120' through a heat removal system that includes thermally-conductive structures 260, 261 of the electronic device 120, 120', thermal interface structure 1140, and the system heat sink 140.

When the heat produced by the semiconductor dies 230, 250 is sufficient to cause a martensite-to-austenite phase transition, the shape memory alloy layer(s) 580 strive to return to their pre-deformed shape. Because each of the shape memory alloy layer(s) 580 are positioned within or adjacent to a compliant TIM layer 520, the shape memory alloy layer(s) 580 may readily deflect within the compliant TIM layer(s) 520. For example, as illustrated in FIG. 11B, the pre-deformed shape of each shape memory alloy layer 580 may be a curved shape. When the shape memory alloy layer(s) 580 return to their pre-deformed shapes due to heating, the shape memory alloy layer(s) 580 exert outward forces on the interior surfaces of the collapsible encasement 810. This may cause the collapsible encasement 810 to expand outwardly, which may ensure good contact with the electronic device 120, 120' and the heat sink 140.

FIG. 11 is a flowchart of a method of fabricating a thermal interface structure (e.g., any of structures 500, 540, 550, 560, 570, 590, 800, 820, 830, 840, 900, 920, FIGS. 5A-F, 8A-D, 9A, 9B) and integrating the structure into an electronic system (e.g., system 100, 600, 630, 1000, 1100, FIGS. 1, 2A, 2B, 6A, 6B, 7A, 7B, 10A, 10B, 11A, 11B). The method may begin, in block 1202, by assembling a stack of multiple layers of different thermal interface materials, including one or more layers of a stiff thermal interface material (e.g., layers 510), and one or more layers of a compliant thermal interface material (e.g., layers 520) connected to the layer(s) of the stiff thermal interface material. In some embodiments, assembling the stack may further include securing one or more shape memory alloy layers (e.g., layers 580) within or in contact with the layer(s) of the compliant thermal interface material. The stiff and compliant thermal interface material layers and, optionally, the shape memory alloy layer(s) form a thermal interface structure. In block 1204, the stack optionally may be enclosed in a collapsible encasement (e.g., encasement 810, 821, 910, 930) to form a stand-alone thermal interface structure.

To assemble a system that includes the thermal interface structure, in block 1206, an electronic component or module (e.g., component 120, 120', 300) is coupled to a surface of a system substrate (e.g., substrate 110). The thermal interface structure is inserted between the electronic component/module and a system heat sink (e.g., heat sink 140), and a securement mechanism (e.g., including screws and bolts 180, 280) is used to connect a system heat sink to the system substrate. The securement mechanism is engaged to apply a clamping force to compress the thermal interface structure between the electronic component and the system heat sink. The clamping force may cause the shape memory alloy, when included in the stack and/or in the collapsible encasement, to deform.

In block 1208, the system is operated, which causes the electronic component/module to produce heat, which is conveyed through the thermal interface structure to the system heat sink. As described above, when the thermal interface structure and/or the collapsible encasement include a shape memory alloy, the heat conveyed through the thermal interface structure may cause the shape memory alloy to attempt to return to a pre-deformed shape. The method then ends.

The above-described embodiments of the present invention include thermal interface structures that may be used to adjust for mechanical tolerance of a system, in addition to providing a good thermal interface between an electronic component and a system heat sink. These embodiments include relatively-thick thermal interface structures with high thermal conductivity, which may be used when mounting application structures (e.g., device 120, 120' and system substrate 110) to a system heat sink (e.g., heat sink 140). The various embodiments include assembling together one or multiple layers of high thermal conductivity, "stiff" thermal interface material(s) with one or multiple layers of "compliant" thermal interface material(s) to increase the total thickness of a thermal interface structure. The number of TIM layers and the thickness of each layer can be adjusted to accommodate the system stack tolerance and system thickness requirement. In some embodiments, the TIM stack can be encased with a collapsible covering to form a stand-alone thermal interface structure. In still other embodiments, a shape memory alloy can be included in the combined thermal interface structure. When a clamping force is applied, the shape memory alloy may deform, and when the system is in operation, heat generated by the devices and components will raise the temperature of the shape memory alloy to cause it to attempt to return to its pre-deformed shape. This may cause the assembly to tighten, and may prevent relaxing over time of the clamping force that mounts the system components together.

An embodiment of a thermal interface structure for transferring heat from an electronic component to a system heat sink includes one or more layers of a stiff thermal interface material and one or more layers of a compliant thermal interface material stacked on and connected to the one or more layers of the compliant thermal interface material. The one or more layers of the compliant thermal interface material and the one or more layers of the stiff thermal interface material form a stack.

An embodiment of an electrical system includes an electronic component, a system heat sink, and a composite thermal interface structure. The composite thermal interface structure has a first surface contacting the electronic component and a second surface contacting the system heat sink. The composite thermal interface structure includes a stack of one or more layers of a stiff thermal interface material, and one or more layers of a compliant thermal interface material stacked on and connected to the one or more layers of the compliant thermal interface material.

An embodiment of a method of manufacturing a thermal interface structure and an electrical system includes assembling a stack of multiple layers of different thermal interface materials, where the stack includes one or more layers of a stiff thermal interface material, and one or more layers of a compliant thermal interface material connected to the one or more layers of the stiff thermal interface material.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A thermal interface structure for transferring heat from an electronic component to a system heat sink, the thermal interface structure comprising:
   a plurality of layers of a stiff thermal interface material; and
   a plurality of layers of a compliant thermal interface material stacked on and connected to the plurality of layers of the stiff thermal interface material, wherein the plurality of layers of the compliant thermal interface material and layers of the plurality of layers of the stiff thermal interface material form a stack, wherein at least one of the plurality of layers of the compliant thermal interface material is formed between two of the plurality of layers of the stiff interface material, and wherein at least one of the plurality of layers of the stiff interface material is formed between two of the plurality of layers of the compliant thermal interface material.

2. The thermal interface structure of claim 1, wherein the compliant thermal interface material is selected from silicone-containing thermal gap filler, liquid solder, non-silicon resin material, thermal grease, thermal conductive grease, thermally conductive epoxy, thermally conductive epoxy paste, and thermally conductive gel.

3. The thermal interface structure of claim 1, wherein the stiff thermal interface material is selected from pyrolytic graphite sheet material, black lead sheet material, electrically conductive graphite sheet material, indium foil, copper foil, silicone sheet material, non-silicon resin sheet material, thermally-conductive gel pad material, silver foil, and silver sinter film.

4. The thermal interface structure of claim 1, wherein:
   the compliant thermal interface material has an XY-plane thermal conductivity in a range from 1 Watt per meter Kelvin (W/mK) to 250 W/mK, and a Z-axis thermal conductivity in a range from 1 W/mK to 250 W/mK; and
   the stiff thermal interface material has an XY-plane thermal conductivity in a range from 50 W/mK to 1700 W/mK, and a Z-axis thermal conductivity in a range from 1 W/mK to 450 W/mK.

5. The thermal interface structure of claim 1, wherein:
   Each of the plurality of layers of the compliant thermal interface material has a thickness in a range from 5 microns to 500 microns; and
   each of the plurality of layers of the stiff thermal interface material has a thickness in a range from 5 microns to 500 microns.

6. The thermal interface structure of claim 1, wherein:
   the plurality of layers of the compliant thermal interface material includes from 2 to 10 layers;
   the plurality of layers of the stiff thermal interface material includes from 2 to 10 layers; and the plurality of layers of the compliant thermal interface material and the plurality of layers of the stiff thermal interface material are stacked and interleaved in an alternating arrangement.

7. The thermal interface structure of claim 1, wherein: at least some of the plurality of layers of the stiff thermal interface material include a through hole that provides a channel through which air and the compliant thermal interface material may flow during compression of the thermal interface structure.

8. The thermal interface structure of claim 1, further comprising:
a collapsible encasement at least partially surrounding the stack.

9. The thermal interface structure of claim 8, wherein the collapsible encasement is formed from a material selected from copper, aluminum, indium, silver, a collapsible metal, and a shape memory alloy.

10. The thermal interface structure of claim 8, wherein the collapsible encasement includes at least one opening through which air and the compliant thermal interface material may flow during compression of the thermal interface structure.

11. The thermal interface structure for transferring heat from an electronic component to a system heat sink of claim 1, wherein the uppermost surface and the lowest surface of the stack include the same material type.

12. The thermal interface structure for transferring heat from an electronic component to a system heat sink of claim 1, further comprising one or more shape memory alloy layers formed below an uppermost surface of the stack and above a lowest surface of the stack, in direct contact with the one or more layers of the compliant thermal interface material.

13. The thermal interface structure of claim 12, wherein the one or more shape memory alloy layers are configured to have a relatively-flat deformed shape that transitions to a curved pre-deformed shape in response to absorbing thermal energy.

14. An electrical system comprising:
an electronic component;
a system heat sink;
a composite thermal interface structure with a first surface contacting the electronic component and a second surface contacting the system heat sink, wherein the composite thermal interface structure includes a stack of a plurality of layers of a stiff thermal interface material, and a plurality of layers of a compliant thermal interface material stacked on and connected to the one or more layers of the stiff thermal interface material, wherein at least one of the plurality of layers of the compliant thermal interface material is formed between two of the plurality of layers of the stiff interface material, and wherein at least one of the plurality of layers of the stiff interface material is formed between two of the plurality of layers of the compliant thermal interface material.

15. The electrical system of claim 14, wherein:
the compliant thermal interface material is selected from silicone-containing thermal gap filler, liquid solder, non-silicon resin material, thermal grease, thermal conductive grease, thermally conductive epoxy, thermally conductive epoxy paste, and thermally conductive gel; and
the stiff thermal interface material is selected from pyrolytic graphite sheet material, black lead sheet material, electrically conductive graphite sheet material, Indium foil, Copper foil, silicone sheet material, non-silicon resin sheet material, thermally-conductive gel pad material, silver foil, and silver sinter film.

16. The electrical system of claim 14, wherein the composite thermal interface structure further comprises:
a collapsible encasement at least partially surrounding the stack.

17. The electrical system of claim 16, wherein the collapsible encasement is formed from a material selected from copper, aluminum, indium, silver, a collapsible metal, and a shape memory alloy.

18. The electrical system of claim 14, wherein the electronic component comprises:
a module substrate having a mounting surface and a thermal interface surface opposite the mounting surface, wherein the thermal interface surface faces the composite thermal interface structure, and the mounting surface faces away from the composite thermal interface structure;
a thermally conductive structure extending through the module substrate and having a first surface co-planar with the mounting surface and a second surface co-planar with the thermal interface surface;
a semiconductor die coupled to the mounting surface of the module substrate and to the first surface of the thermally conductive structure; and
a plurality of terminals extending from the mounting surface.

19. The electrical system of claim 18, further comprising:
a system substrate with a plurality of terminal pads at a first surface of the system substrate, wherein the plurality of terminals of the electronic component are connected to the plurality of terminal pads; and
a securement mechanism that connects the system heat sink to the system substrate, and that provides a clamping force to compress the composite thermal interface structure between the electronic component and the system heat sink.

20. A method of manufacturing a thermal interface structure and an electrical system, the method comprising:
Assembling a stack of multiple layers of different thermal interface materials, wherein the stack includes a plurality of layers of a stiff thermal interface material, a plurality of layers of a compliant thermal interface material connected to the layers of the stiff thermal interface material, and one or more shape memory alloy layers formed below an uppermost surface of the stack and above a lowest surface of the stack, within or in contact with the layers of the compliant thermal interface material, wherein at least one of the plurality of layers of the compliant thermal interface material is formed between two of the plurality of layers of the stiff interface material, and wherein at least one of the plurality of layers of the stiff interface material is formed between two of the plurality of layers of the compliant thermal interface material.

21. The method of claim 20, further comprising:
at least partially enclosing the stack with a collapsible encasement.

22. The method of claim 20, further comprising:
coupling an electronic component to a surface of a system substrate;
inserting the stack between the electronic component and a system heat sink; and
connecting the system heat sink to the system substrate with a securement mechanism that applies a clamping force to compress the stack between the electronic component and the system heat sink.

\* \* \* \* \*